US006594815B2

(12) United States Patent
Lee et al.

(10) Patent No.: US 6,594,815 B2
(45) Date of Patent: Jul. 15, 2003

(54) ASYNCHRONOUS CONTROLLER GENERATION METHOD

(76) Inventors: Dong I. Lee, 35-206 Faculty APT., K-Jist. 1, Oryong-Dong, Buk-Ku, Kwangju (KR); Eui S. Kim, 109-306 Samnujng APT., 759-2, Wolge-Dong, Kwangsan-Ku, Kwangju (KR); Jeong G. Lee, Student Dorm., K-Jist, 1 Oryong-Dong, Puk-Ku, Kwangju (KR)

( * ) Notice: Subject to any disclaimer, the term of this patent is extended or adjusted under 35 U.S.C. 154(b) by 365 days.

(21) Appl. No.: 09/792,749

(22) Filed: Feb. 23, 2001

(65) Prior Publication Data

US 2002/0019671 A1 Feb. 14, 2002

(30) Foreign Application Priority Data

Aug. 14, 2000 (KR) ......................... 2000-46852

(51) Int. Cl.$^7$ ..................... G06F 17/50; G06F 5/00; G05B 19/42
(52) U.S. Cl. ..................... 716/18; 700/86; 712/201
(58) Field of Search ..................... 716/18; 700/86; 712/201

(56) References Cited

U.S. PATENT DOCUMENTS

| 5,469,367 A | * | 11/1995 | Puri et al. ..................... 716/18 |
| 5,493,505 A | * | 2/1996 | Banerjee et al. ............... 716/18 |
| 5,612,866 A | * | 3/1997 | Savanyo et al. ............... 700/86 |
| 5,870,588 A | * | 2/1999 | Rompaey et al. ............. 703/13 |
| 5,918,042 A | * | 6/1999 | Furber ......................... 713/600 |
| 6,055,620 A | * | 4/2000 | Paver et al. ................. 712/201 |

FOREIGN PATENT DOCUMENTS

KR  20000046852  8/2000

OTHER PUBLICATIONS

E. Kim et al , "Building a Distributed Asynchronous Control Unit Through Automatic Derivation of Hierarchically Decomposed AFSMs from a CDFG", Proceedings Advanced Research in VLSI, 2001, ARVLSI 2001, Mar. 14, 2001–Mar. 16, 2001, pp. 2–15.*
K. Y. Yun, "Recent Advances in Asynchronous Design Methodologies", Proceedings of the Design Automation Conference, ASP–DAC '99, Jan. 1, 1999–18/21/1999, pp. 253–259.*

* cited by examiner

Primary Examiner—Matthew Smith
Assistant Examiner—Magid Dimyan
(74) Attorney, Agent, or Firm—Park & Sutton LLP; John K. Park

(57) ABSTRACT

A method for generating an asynchronous controller includes a process controller formation step S100 of forming a signal transition graph representing a state of change in input/output signals of a plurality of process controllers PC1~PC4 for outputting control signals necessary for executing a process corresponding to a node in a data flow graph showing a performance sequence between a plurality of nodes each representing a process and a plurality of processes, a process sequencing controller formation step S400 of forming a signal transition graph of a process sequencing controller PSC according to a performance sequence of the process controllers PC1~PC4 from the data flow graph, and a logic synthesis step S500 of generating an asynchronous controller in a logic synthesis program, by using the state of change in the input/output signals on the signal transition graph of the process controllers PC1~PC4 formed in the process controller formation step S100 and the state of change in the input/output signals on the signal transition graph of the process sequencing controller PSC formed in the process sequencing controller formation step S400. The asynchronous controller is divided into the process controller and the process sequencing controller, which provides advantages in an area, performance and a synthesis time.

12 Claims, 14 Drawing Sheets

ASYNCHRONOUS CONTROLLER GENERATION METHOD

CLAIMING FOREIGN PRIORITY

The applicant claims and requests a foreign priority, through the Paris Convention for the Protection of Industry Property, based on a patent application filed in the Republic of Korea (South Korea) with the filing date of Aug. 14, 2000, with the patent application number 2000-0046852, by the applicant. (See the Attached Declaration)

BACKGROUND OF THE INVENTION

1. Field of the Invention

The present invention relates to an asynchronous controller generation method, and more particularly, to a process-oriented asynchronous controller generation method in which an asynchronous controller is divided into a process controller and a process sequencing controller on the basis of a process corresponding to a node on a data flow graph.

2. Description of the Related Art

As an ultra-high speed and low power consumption system is rapidly spread and increasingly required, a system design trends based on an asynchronous method. In particular, an asynchronous system has a little clock skew, low power consumption, a high performance and a low electromagnetic interference in comparison with those of a synchronous system.

In the conventional art, an asynchronous control circuit generation is classified into a centralized control circuit generation method and a hardware-oriented control circuit generation method.

FIG. 1 is a block diagram showing an asynchronous controller of a conventional centralized controller generation method.

The whole system of FIG. 1 includes an input/output processing part 20 having an input selector 21, a register 22 and an output selector 23, a data processor 30 including adders, subtracters and multipliers for performing various operations and a controller 10. The conventional centralized controller generation method includes only one integrated controller 10 with respect to the whole system, which method is typically used in the design of a control circuit with respect to a synchronous system, which operates in synchronization with global clock. In the case of the centralized controller generation method, all control signals should be generated from the controller 10 and the size of the controller 10 is generally large. Thus, in the case that the above controller design method is applied to an asynchronous controller, many pieces of information concerning jobs and job sequence to be performed in a system is integrated in a single controller, to thereby cause a complicated specification. In this case, the asynchronous controller of the centralized controller generation method without having global clock cannot realize a large-scale asynchronous controller without reduction in a parallel performance, increase in a circuitry area, increase in a synthesis time at the time of performing a synthesis with an existing asynchronous logic synthesis program, and any hazard.

FIG. 2 is a block diagram showing an asynchronous controller of a conventional hardware-oriented controller generation method.

The asynchronous controller 40 of a conventional hardware-oriented controller generation method of FIG. 2 employs a controller design method contrived for an asynchronous system in which the controller 40 is divided into a number of control circuits CP1~CPn on the basis of hardware constituting the system in order to solve the problems generated in the asynchronous controller of the centralized controller generation method. In this method, the designer can divide the whole control circuit on the basis of the construction module of the circuit, and thus is more effective at the time of designing a small-scale system. However, in the case that the number of the hardware components is limited in relation with the circuit area, the asynchronous controller of the conventional hardware-oriented controller generation method also has problems of reduction of performance, increase in the area and synthesis time rapidly in the same way as those of the controller of the centralized controller generation method.

SUMMARY OF THE INVENTION

To solve the above problems, it is an object of the present invention to provide a process-oriented asynchronous controller generation method having an excellent area, performance and synthesis time, in which an asynchronous controller is divided and induced into a number of process controllers for generating control signals necessary for performing a process corresponding to a node on a data flow graph and a process sequencing controller for controlling a performance sequence of each process controller from the data flow graph.

To accomplish the above object of the present invention, there is provided a method for generating an asynchronous controller for forming a signal transition graph representing a state of change in input/output signals of the asynchronous controller from a data flow graph showing a performance sequence between a plurality of nodes each representing a process and a plurality of processes, and controlling a data processor to perform an operation from the signal transition graph by a logic synthesis program, the asynchronous controller generation method comprising: a process controller formation step of forming a signal transition graph of a plurality of process controllers for outputting control signals necessary for executing a process corresponding to a node in the data flow graph; a process sequencing controller formation step of forming a signal transition graph of a process sequencing controller according to a performance sequence of the process controllers from the data flow graph; and a logic synthesis step of generating an asynchronous controller in a logic synthesis program, by using the state of change in the input/output signals on the signal transition graph of the process controllers formed in the process controller formation step and the state of change in the input/output signals on the signal transition graph of the process sequencing controller formed in the process sequencing controller formation step.

According to another aspect of the present invention, there is also provided a method for generating an asynchronous controller for forming a finite state machine including an input burst which is a set of input signals of the asynchronous controller and an output burst which is a set of output signals corresponding to the input signals from a data flow graph showing a performance sequence between a plurality of nodes each representing a process and a plurality of processes, and controlling a data processor to perform an operation from the finite state machine by a logic synthesis program, the asynchronous controller generation method comprising: a process controller formation step of forming a finite state machine including an input burst being a set of input signals input to a process controller and an output burst being a set of output signals output from the process controller in order to output control signals necessary for executing a process corresponding to a node in the data flow graph; a process sequencing controller formation step of forming a finite state machine of a process sequencing controller according to a performance sequence of the process controllers from the data flow graph; and a logic synthesis step of generating an asynchronous controller in a logic synthesis program, by using the state of change in the input burst and the output burst of the finite state machine in the process controllers formed in the process controller formation step and the state of change in the input burst and the output burst in the finite state machine of the process sequencing controller formed in the process sequencing controller formation step.

BRIEF DESCRIPTION OF THE DRAWINGS

The above object and other advantages of the present invention will become more apparent by describing the preferred embodiment thereof in more detail with reference to the accompanying drawings in which.

DETAILED DESCRIPTION OF THE INVENTION

An asynchronous controller generation method according to a preferred embodiment of the present invention will be described with reference to the accompanying drawings.

Figure 1:
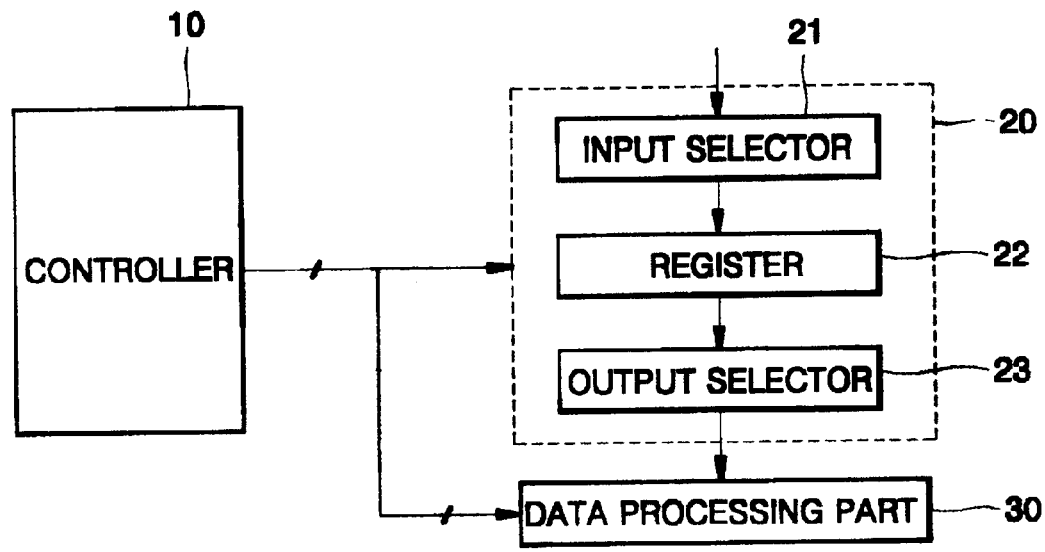
FIG. 1 is a block diagram showing an asynchronous controller of a conventional centralized controller generation method.
Figure 2:
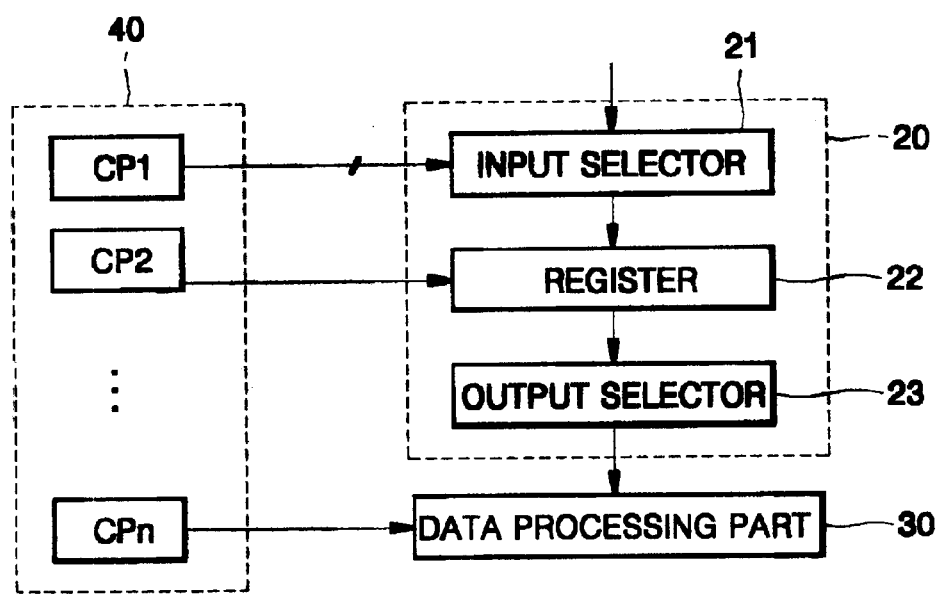
FIG. 2 is a block diagram showing an asynchronous controller of a conventional hardware-oriented controller generation method.
Figure 3:
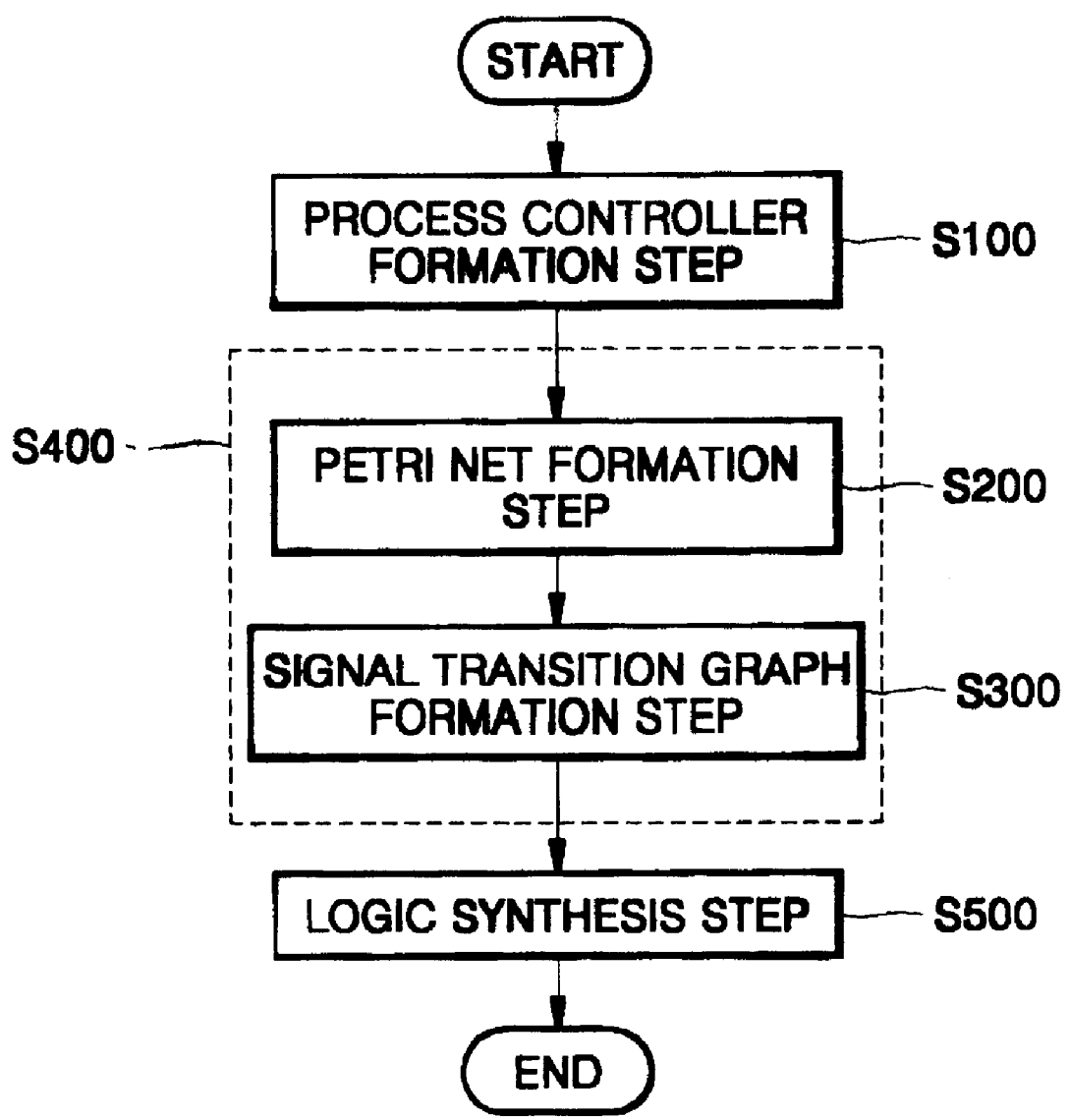
FIG. 3 is a flow-chart view showing a process-oriented asynchronous controller generation method according to a first embodiment of the present invention.

Referring to FIG. 3, an asynchronous controller generation method according to the present invention includes: a process controller formation step S100 of forming a signal transition graph representing a state of change in input/output signals of a plurality of process controllers PC1~PC4 for outputting control signals necessary for executing a process corresponding to a node in a data flow graph showing a performance sequence between a plurality of nodes each representing a process and a plurality of processes; a process sequencing controller formation step S400 of forming a signal transition graph of a process sequencing controller PSC according to a performance sequence of the process controllers PC1~PC4 from the data flow graph; and a logic synthesis step S500 of generating an asynchronous controller in a logic synthesis program, by using the state of change in the input/output signals on the signal transition graph of the process controllers PC1~PC4 formed in the process controller formation step S100 and the state of change in the input/output signals on the signal transition graph of the process sequencing controller PSC formed in the process sequencing controller formation step S400.

The process sequencing controller formation step S400 includes: a petri net formation step S200 of forming a petri net of a process sequencing controller PSC comprised of a transition representing an operation according to a performance sequence of process controllers PC1~PC4 from the data flow graph, a place representing a state, a connection relationship between the transition and the place; and a signal transition graph formation step S300 of forming a signal transition graph having a state of change in input/output signals of the process sequencing controller PSC using the transition of the petri net.

Figure 4:
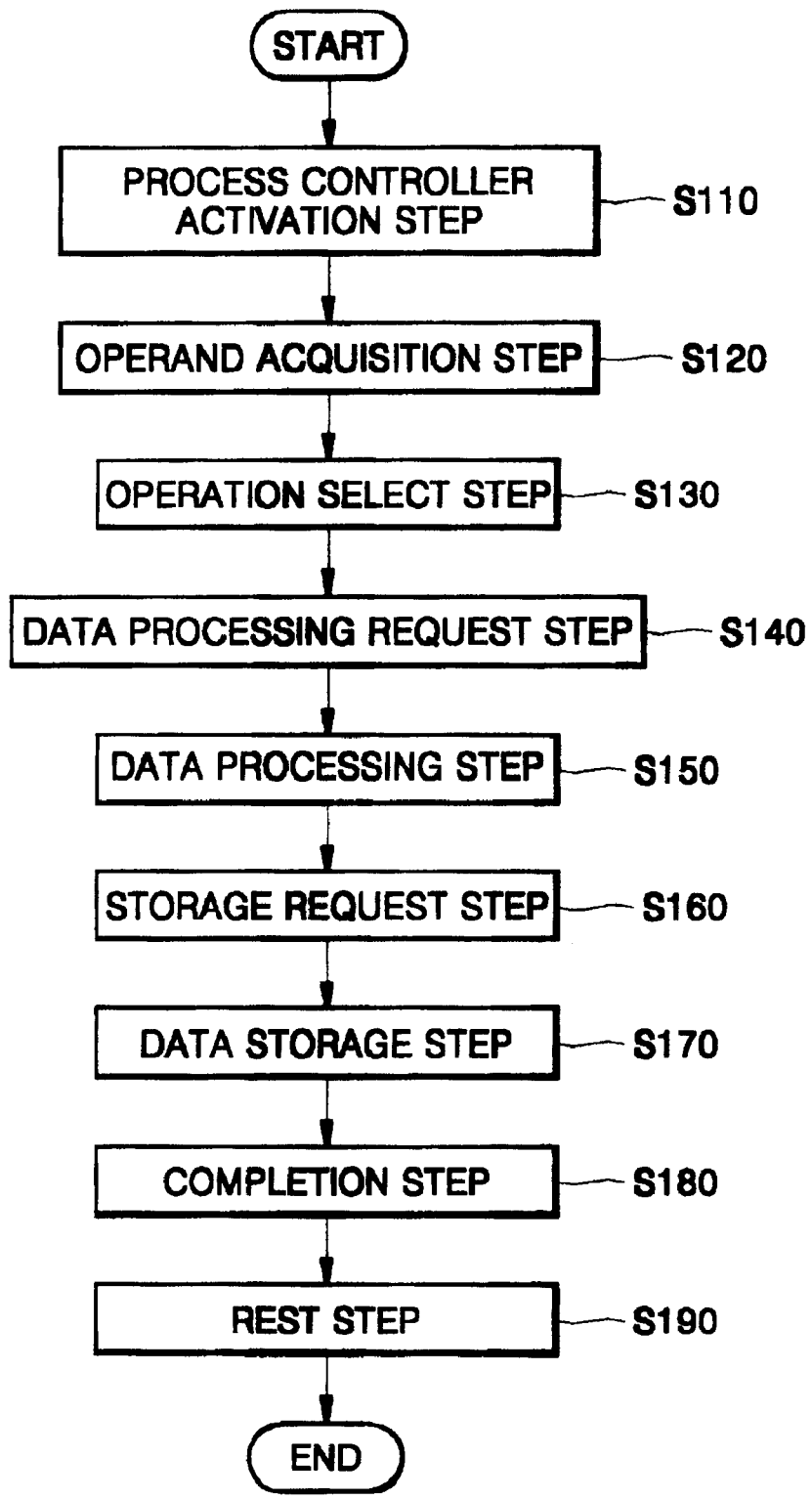
FIG. 4 is a flow-chart view showing a process controller formation step according to the present invention.

As shown in FIG. 4 showing a process controller formation step according to a first embodiment of the present invention, the process controller formation step S100 includes: a process controller activation step S110 for activating a process controller PC by a request start ascending signal ReqStart+ for starting a computing operation in a data processor FU output from the process sequencing controller PSC; an operand acquisition step S120 of outputting operand request ascending signals ReqOP1+ and ReqOP1+ in order to acquire operands OP1 and OP2 for performing an operation by the data processor FU, which is performed in the process controller PC; a data processing request step S140 of outputting a data processing request ascending signal ReqFU+ to the data processor FU in order to perform an operation by the data processor FU, which is performed in the process controller PC; a data processing step S150 for performing an operation by the operands acquired in the operand acquisition step S120 and outputting a data processing response ascending signal AckFU+ to the process controller PC with respect to an operation performance completion, in response to the data processing request ascending signal ReqFU+ output from the data processing request step S140; a storage request step S160 of outputting a storage request ascending signal ReqWDR+ to a target register R, in order to activate the target register R and in order to store the operation result performed in the data processor FU, which is performed in the process controller PC; a data storage step S170 for storing the operation result in response to the storage request ascending signal AckWDR+ output from the storage request step S160 and outputting a storage response ascending signal AckWDR+ to the process controller PC, which is performed in the target register R; a completion step S180 of outputting a response start ascending signal AckStart+ representing a computing operation completion of the data processor FU to the process sequencing controller PSC, which is performed in the process controller PC; and a rest step S190 of outputting descending signals ReqStart−, ReqOP1−, ReqOP1−, ReqFU−, AckFU−, ReqWDR−, AckWDR−, and AckStart− with respect to all the ascending signals ReqStart+, ReqOP1+, ReqOP1+, ReqFU+, AckFU+, ReqWDR+, AckWDR+, and AckStart+ in order to restore all the ascending signals ReqStart+, ReqOP1+, ReqOP1+, ReqFU+, AckFU+, ReqWDR+, AckWDR+, and AckStart+ into initial states, which is performed in the process controller PC.

In the case that a number of operations are performed in the data processor FU referring to FIG. 4, the data processing request step S140 further includes an operation select step S130 of outputting an operation code request ascending signal OPcode+ to the data processor FU in order to identify each operation, which is performed in the process controller PC.

In the case of a second embodiment of the process controller formation step according to the present invention, the computing operation is not performed in the data processor FU as in the first embodiment of FIG. 4, and a signal transition graph for storing an operand directly in the target register is formed.

That is, the process controller formation step according to the second embodiment of the present invention, includes: a process controller activation step S110 for activating a process controller PC by a request start ascending signal ReqStart+ output from the process sequencing controller PSC; an operand acquisition step S120 of outputting an operand request ascending signals ReqOP1+ in order to acquire an operand OP1, which is performed in the process controller PC; a storage request step S160 of outputting a storage request ascending signal ReqWDR+ to a target register R, in order to activate the target register R and in order to store the operand OP1 acquired in the operand acquisition step S120 in the target register R, which is performed in the process controller PC; a data storage step S170 for storing the operand OP1 in response to the storage request ascending signal AckWDR+ output from the storage request step S160 and outputting a storage response ascending signal AckWDR+ to the process controller PC, which is performed in the target register R; a completion step S180 of outputting a response start ascending signal AckStart+ representing an operand storage completion to the process sequencing controller PSC, which is performed in the process controller PC; and a rest step S190 of outputting descending signals ReqStart−, ReqOP1−, ReqOP1−, ReqFU−, AckFU−, ReqWDR−, AckWDR−, and AckStart− with respect to all the ascending signals ReqStart+, ReqOP1+, ReqOP1+, ReqFU+, AckFU+, ReqWDR+, AckWDR+, and AckStart+ in order to restore all the ascending signals ReqStart+, ReqOP1+, ReqOP1+, ReqFU+, AckFU+, ReqWDR+, AckWDR+, and AckStart+ into initial states, which is performed in the process controller PC.

Figure 8:
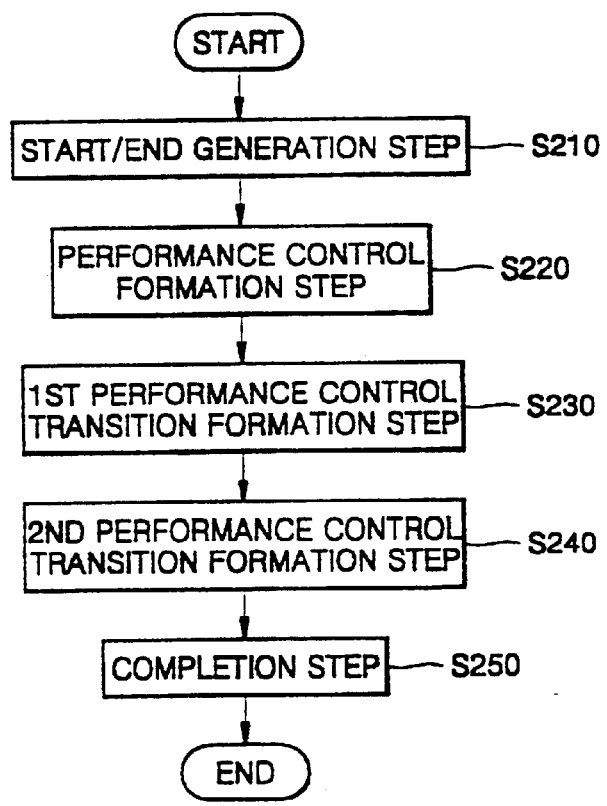
FIG. 8 is a flow-chart view showing a petri net formation step of the process sequencing controller according to the present invention.

FIG. 8 is a flow-chart view showing a petri net formation step according to the present invention.

The petri net formation step of FIG. 8 includes: a start/end generation step S210 of generating a start transition START and an end transition END representing a start and an end of the petri net, respectively; a performance control formation step S220 of generating performance control transitions PC1~PC4 corresponding to an operation of each node OPN1~OPN4 on the data flow graph, connecting the performance control transitions according to a sequence if there is a sequential connection relationship between the respective nodes on the data flow graph, and setting a place P between the respective performance control transition connections; a first performance control transition formation step S230 of generating a connection from the start transition START with respect to the performance control transitions PC1 and PC2, corresponding to nodes OPN1 and OPN2 having no preceding node on the data flow graph and setting a place P at a connection between the start START and each of the performance control transitions PC1 and PC2; a second performance control transition formation step S240 of generating a connection from the performance control transitions PC3 and PC4 to the end transition END, corresponding to nodes OPN3 and OPN4 having no following node on the data flow graph and setting a place P at a connection between each of the performance control transitions PC3 and PC4 and the end transition END; and a completion step S250 of generating a connection from the end transition END to the start transition START formed in the start/end generation step S210, setting a place P at a connection between the end transition END and the start transition START and forming a token representing a start position at the set place.

Figure 10:
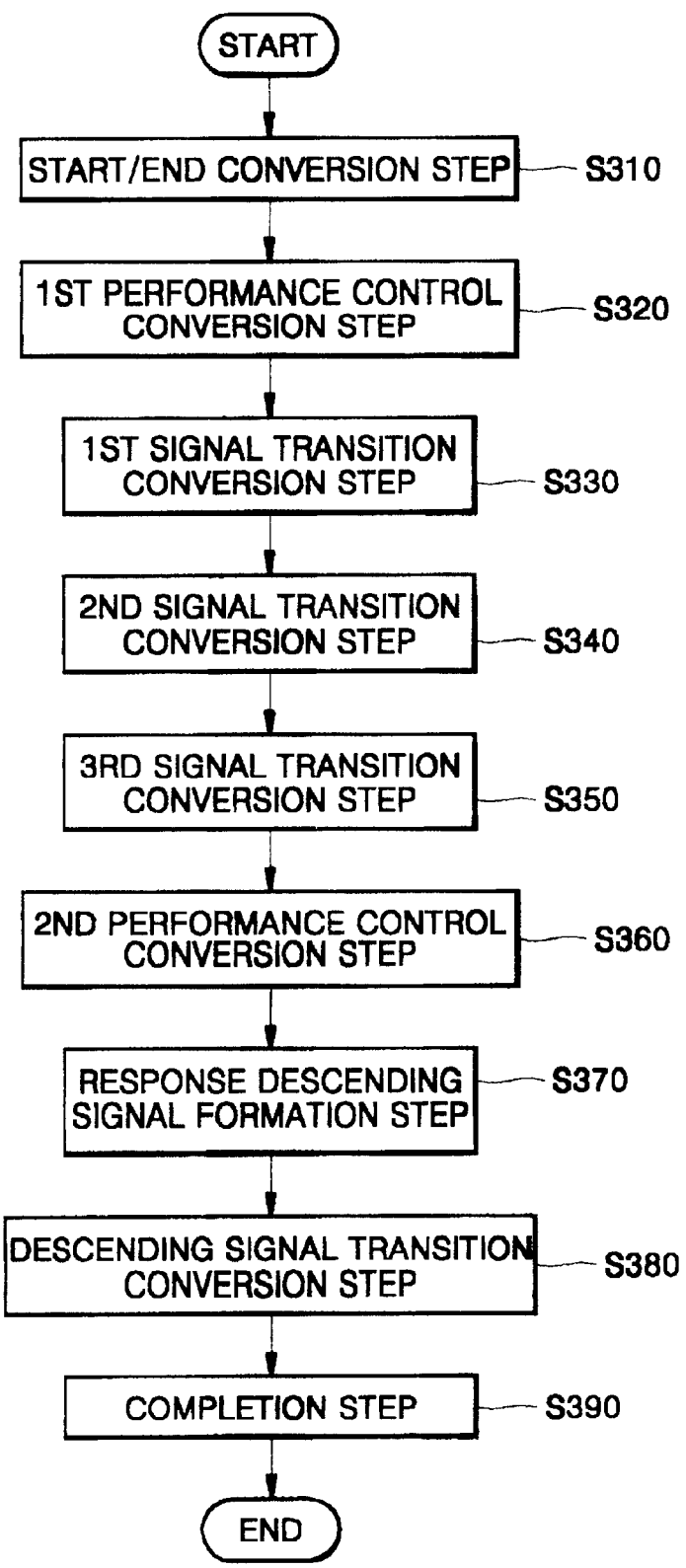
FIG. 10 is a flow-chart view illustrating a signal transition graph formation step for the process sequencing controller according to the present invention.

FIG. 10 is a flow-chart view illustrating a signal transition graph formation step for the process sequencing controller according to the present invention.

The signal transition graph formation step of FIG. 10 includes: a start/end conversion step S310 of converting the start transition START of the petri net into a request ascending signal Req+, converting the end transition END into a response ascending signal Ack+ and a request descending signal Req− to thereby form a signal transition state from the response ascending signal Ack+ to the request descending signal Req−; a first performance control conversion step S320 of converting each of the performance control transitions PC1~PC4 of the petri net into performance request ascending signals ReqPC1+, ReqPC2+, ReqPC3+, and ReqPC4+ and performance response ascending signals AckPC1+, AckPC2+, AckPC3+, and AckPC4+, and forming a signal transition state from the performance request ascending signals ReqPC1+, ReqPC2+, ReqPC3+, and ReqPC4+ to the performance response ascending signals AckPC1+, AckPC2+, AckPC3+, and AckPC4+; a first signal transition conversion step S330 of forming a signal transition state from the request ascending signal Req+ formed in the start/end conversion step S310 to the performance request ascending signals ReqPC1+ and ReqPC2+ formed in the first performance control conversion step S320, with respect to each of all the performance control transitions PC1 and PC2 connected through the start transition START and the place P of the petri net; a second signal transition conversion step S340 of forming a signal transition state from the performance request ascending signals ReqPC3+ and ReqPC4+ formed in the first performance control conversion step S320 to the response ascending signal Ack+ formed in the start/end conversion step S310 with respect to each of all the performance control transitions PC3 and PC4 preceding the end transition END and connected through the end transition END and the place P of the petri net; a third signal transition conversion step S350 of forming a signal transition state from the performance response ascending signals AckPC1+ and AckPC2+ of the current performance control transitions PC1 and PC2 to the performance request ascending signals ReqPC3+ and ReqPC4+ of the next performance control transitions PC3 and PC4, in the case that the current performance control transitions PC1 and PC2, the following performance control transitions PC3 and PC4 and the places P are connected in sequence on the petri net; a second performance control conversion step S360 of converting each of the performance control transitions PC1~PC4 of the petri net into performance request descending signals ReqPC1−, ReqPC2−, ReqPC3− and ReqPC4− and performance response descending signals AckPC1−, AckPC2−, AckPC3− and AckPC4− and forming a signal transition state from the performance request descending signals ReqPC1−, ReqPC2−, ReqPC3− and ReqPC4− to the performance response descending signals AckPC1−, AckPC2−, AckPC3− and AckPC4−; a response descending signal formation step S370 of forming a response descending signal Ack− corresponding to the request ascending signal Req+ of the start/end conversion step S310; a descending signal transition conversion step S380 of forming a signal transition state from the request descending signal Req− of the start/end conversion step S310 to all the performance request descending signals ReqPC1−, ReqPC2−, ReqPC3− and ReqPC1− generated in the second performance control conversion step S360, and forming a signal transition state from all the performance response descending signals AckPC1−, AckPC2−, AckPC3− and AckPC4− generated in the second performance control conversion step S360 to the response descending signal Ack−; and a completion step S390 of forming a signal transition state from the response descending signal Ack− to the request ascending signal Req+, and forming a token T representing a start position of the signal transition graph.

Figure 12:
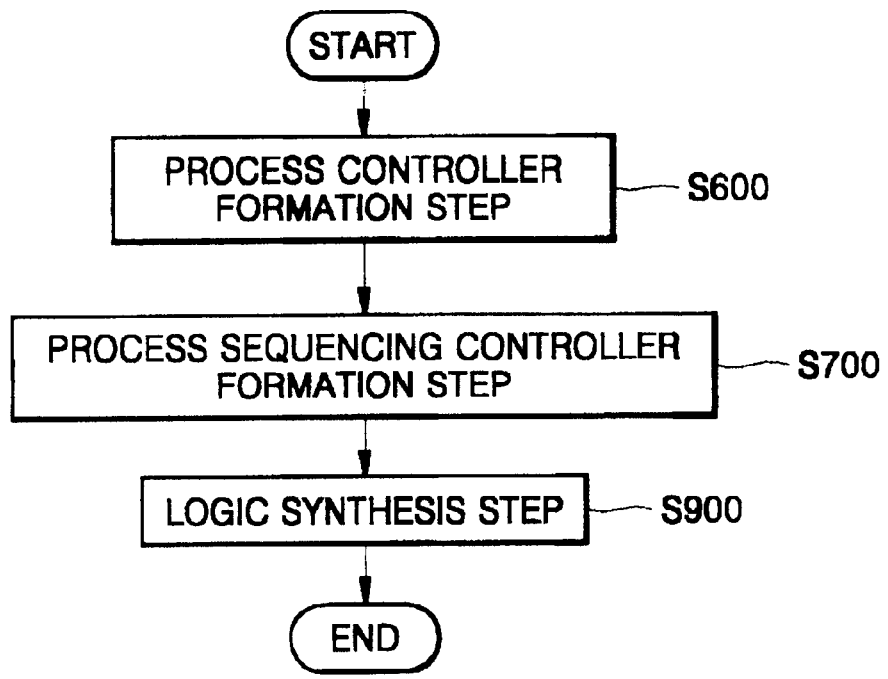
FIG. 12 is a flow-chart view showing a process-oriented asynchronous controller generation method according to a second embodiment of the present invention.

A method for generating an asynchronous controller according to the second embodiment of the present invention as shown in FIG. 12 includes: a process controller formation step S600 of forming a finite state machine including an input burst which is a set of input signals input to the process controller PC and an output burst which is a set of output signals output from the process controller PC, in order to output control signals necessary for performing a process corresponding to a node on the data flow graph showing a performance sequence between a plurality of nodes each representing a process and a plurality of processes; a process sequencing controller formation step S700 of forming a finite state machine of a process sequencing controller according to a performance sequence of the process controllers PC from the data flow graph; and a logic synthesis step S900 of generating an asynchronous controller in a logic synthesis program, by using the state of change in the input burst and the output burst of the finite state machine in the process controllers PC formed in the process controller formation step S600 and the state of change in the input burst and the output burst in the finite state machine of the process sequencing controller PSC formed in the process sequencing controller formation step S700.

Figure 13A:
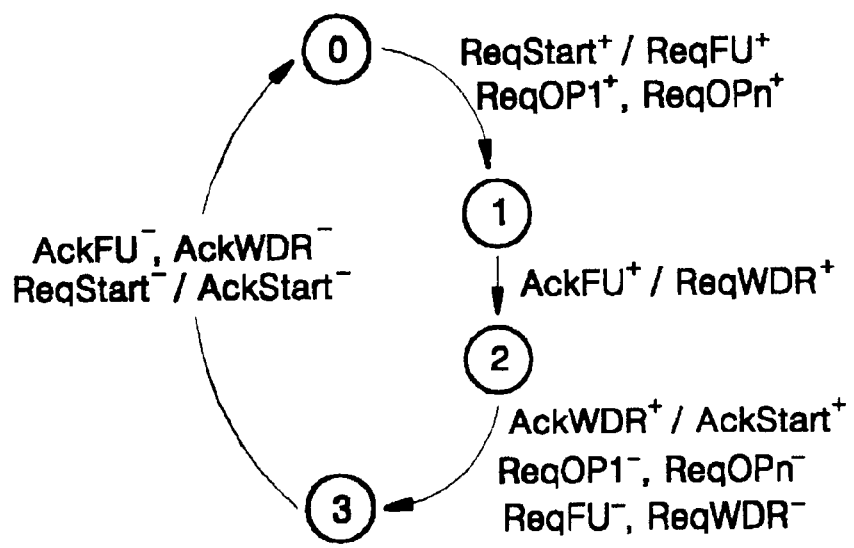
FIG. 13A is a first embodiment of the finite state machine with respect to the process controller according to the present invention.

The process controller formation step S600 according to the first embodiment of the present invention as shown in FIG. 13A, includes: a first stage including the steps of forming a connection from an initial state 0 to a first state 1, forming a request start ascending signal ReqStart+ output from the process sequencing controller PSC and input to the process controller PC as an input burst from the initial state 0 to the first state 1, and forming operand request ascending signals ReqOP1+ and ReqOP2+ according to a request start ascending signal ReqStart+ and a data processing request ascending signal ReqFU+ for performing an operation in the data processor FU, as an output burst; a second stage including the steps of forming a connection from the first state 1 to a second state 2, performing an operation by an operand in the data processor FU in response to the data processing request ascending signal ReqFU+, forming a data processing response ascending signal AckFU+ with respect to an operation performance completion input from the data processor FU to the process controller PC, as an input burst, and forming a storage request ascending signal ReqWDR+ for activating a target register R in order to store an operation result performed in the data processor FU according to the data processing response ascending signal AckFU+ in the target register R, as an output burst; a third stage including the steps of forming a connection from the second state 2 to a third state 3, forming a storage response ascending signal AckWDR+ with respect to an operation result storage completion input from the target register R to the process controller PC in response to the storage request ascending signal ReqWDR+ as an input burst, and forming a response start ascending signal AckStart+ output from the process controller PC to the process sequencing controller PSC in response to a request start ascending signal ReqStart+, and operand request descending signals ReqOP1− and ReqOP2−, a data processing request descending signal ReqFU− and storage request descending signal ReqWDR− for restoring operand request ascending signals ReqOP1+ and ReqOP2+, a data processing request ascending signal ReqFU+ and a storage request ascending signal ReqWDR+ output from the process controller PC, as an output burst; and a fourth stage including the steps of forming a connection from the third state 3 to the initial state 0, forming a data processing response descending signal AckFU−, a storage response descending signal AckWDR− and a request start descending signal ReqStart− for restoring all of the data processing response ascending signal AckFU+, the storage response ascending signal AckWDR+ and the request start ascending signal ReqStart+ input to the process controller PC into the initial states, as an input burst, and forming the response start descending signal AckStart− for restoring the response start ascending signal AckStart+ output from the process controller PC to the process sequencing controller PSC into the initial state, as an output burst.

Figure 13B:
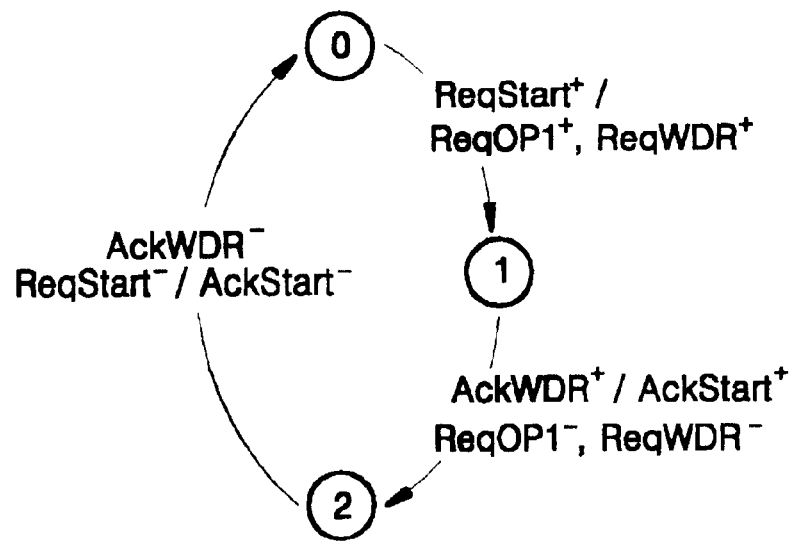
FIG. 13B is a second embodiment of the finite state machine with respect to the process controller according to the present invention.

The process controller formation step S600 according to the second embodiment of the present invention as shown in FIG. 13B, includes: a first stage including the steps of forming a connection from an initial state 0 to a first state 1, forming a request start ascending signal ReqStart+ output from the process sequencing controller PSC and input to the process controller PC as an input burst from the initial state 0 to the first state 1, and forming an operand request ascending signal ReqOP1+ and a storage request ascending signal ReqWDR+ for activating a target register R in order to store an operand in the target register R, as an output burst; a second stage including the steps of forming a connection from the first state 1 to a second state 2, forming a storage response ascending signal AckWDR+ with respect to an operand OP1 storage completion input from the target register R to the process controller PC in response to the storage request ascending signal ReqWDR+, as an input burst, and forming a response start ascending signal AckStart+ output from the process controller PC to the process sequencing controller PSC in response to the request start ascending signal ReqStart+, an operand request descending signal ReqOP1− and a storage request descending signal ReqWDR− for restoring an operand request ascending signal ReqOP1+ and a storage request ascending signal ReqWDR+ output from the process controller PC into the initial states, as an output burst; and a third stage including the steps of forming a connection from the second state 2 to the initial state 0, forming a storage response descending signal AckWDR− and a request start descending signal ReqStart− for restoring all of the storage response ascending signal AckWDR+ and the request start ascending signal ReqStart+ input to the process controller PC into the initial states, as an input burst, and forming a response start descending signal AckStart− for restoring a response start ascending signal AckStart+ output from the process controller PC to the process sequencing controller PSC into the initial state, as an output burst.

Figure 13C:
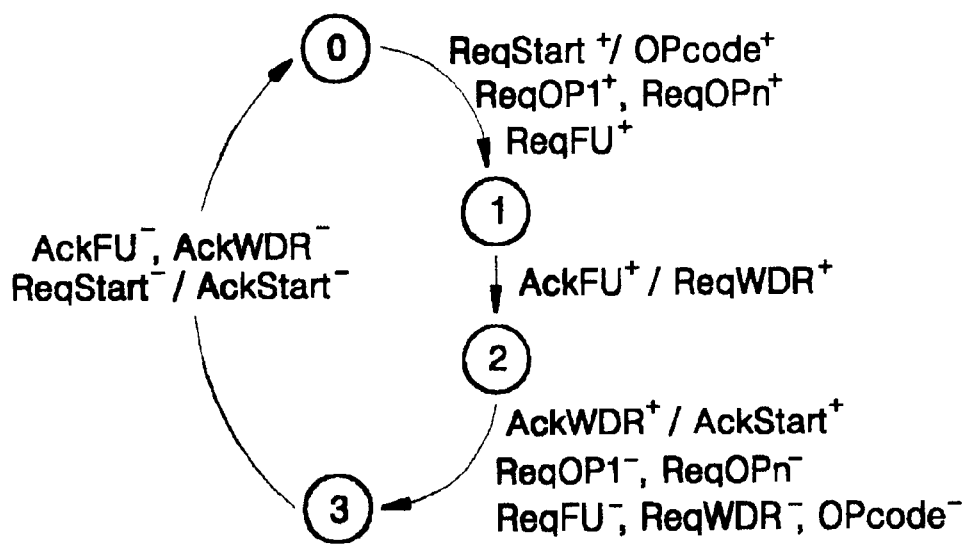
FIG. 13C is a third embodiment of the finite state machine with respect to the process controller according to the present invention.

The process controller formation step S600 according to the third embodiment of the present invention as shown in FIG. 13C is same as that of the first embodiment of the present invention of FIG. 13A. In the process controller formation step S600 according to the third embodiment of the present invention as shown in FIG. 13C, an operation code request ascending signal Opcode+ for identifying each operation is further formed at the connection formation step from the initial state 0 to the first state 1 in the output burst and an operation code request descending signal Opcode− for restoring the operation code request ascending signal Opcode+ into the initial state is further formed at the connection formation step from the second state 2 to the third state 3 in the output burst, in the case that a number of operations are performed in the data processor FU.

Figure 14:
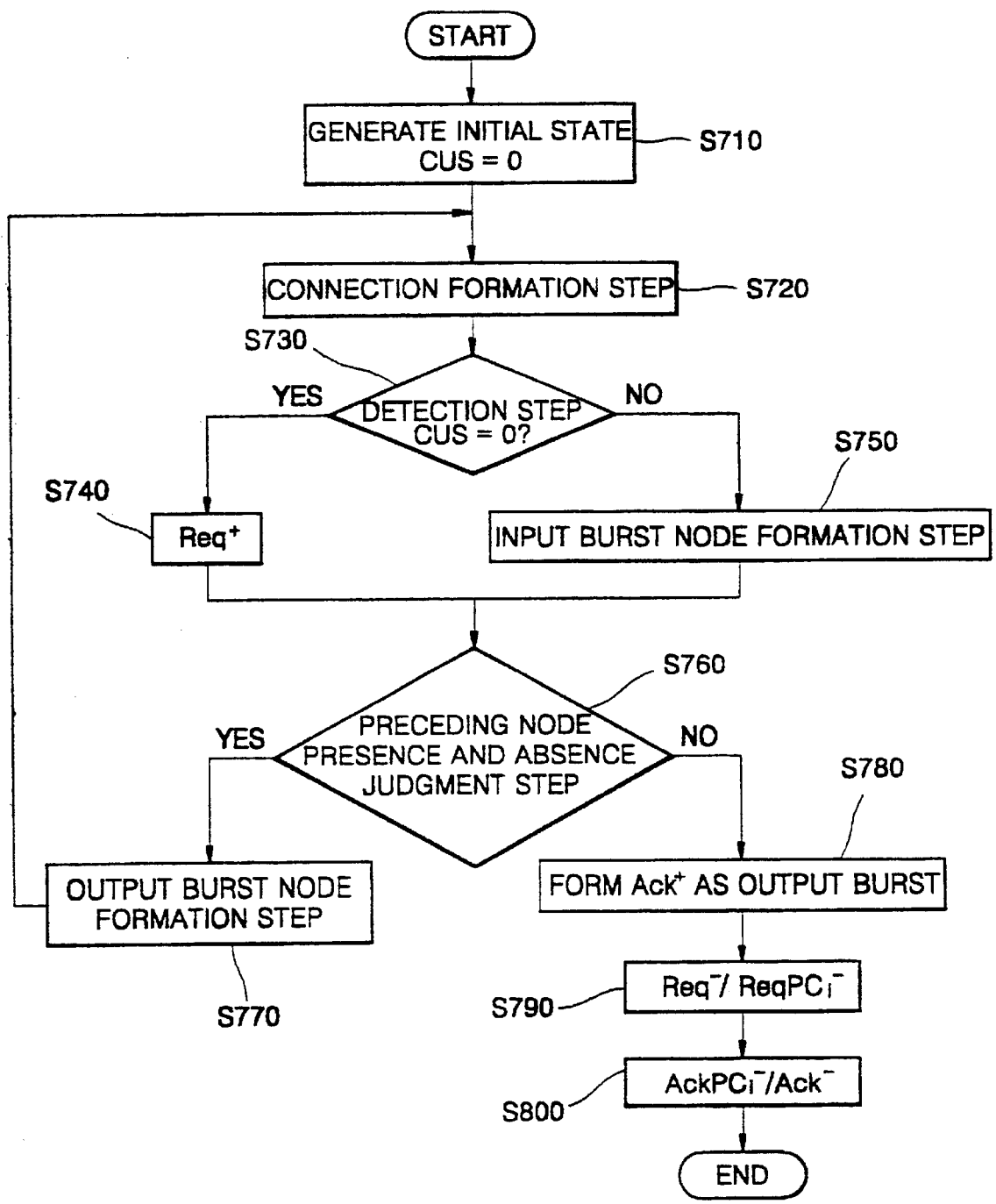
FIG. 14 is a flow-chart view showing a finite state machine with respect to the process sequencing controller according to the present invention from the data flow graph.

The process sequencing controller formation step S700 according to the present invention as shown in FIG. 14, includes: an initial state formation step S710 of forming an initial state 0 and setting a current state variable CUS representing a current state into zero; a connection formation step S720 of a following state whenever the current state variable CUS increases by one, and forming a connection relationship from the current state to the following state; a detection step S730 of detecting whether the current state variable CUS is zero; a request start ascending signal formation step S740 of forming a request start ascending signal Req+ in the input burst of the connection relationship if the current state variable CUS is zero in the detection step S730; an input burst node formation step S750 of forming response ascending signals AckPC1+, AckPC2+, AckPC3+ and AckPC4+ corresponding to performance request ascending signals ReqPC1+, ReqPC2+, ReqPC3+ and ReqPC4+ constituting an output burst of the connection relationship from the previous state prior to the current state to the current state if the current state variable CUS is not zero in the detection step S730; a preceding node presence and absence judgement step S760 of detecting whether a node having no preceding node exists on the data flow graph; an output burst node formation step S770 of forming performance request ascending signals ReqPC1+ and ReqPC2+ corresponding to nodes OPN1 and OPN2 as an output burst if the nodes OPN1 and OPN2 having no preceding node exist in the preceding node presence and absence judgment step S760, increasing the current state variable CUS by one after deleting the nodes OPN1 and OPN2 having no preceding node and proceeding to the connection formation step S720; an output burst formation step S780 of forming a response start ascending signal Ack+ corresponding to a request start ascending signal Req+ as an output burst, if a node having no preceding node does not exist in the preceding node presence and absence judgment step S760; a performance request burst formation step S790 of forming a response start ascending signal Ack+ as an output burst, then increasing the current state variable CUS by one, then forming a following state, forming a connection relationship from the current state to the following state, forming a request start descending signal Req− for restoring a request start ascending signal Req+ into the initial state as an input burst of a corresponding connection relationship, and forming performance request descending signals ReqPC1−~ReqPC4− for restoring all the performance request ascending signals ReqPC1+~ReqPC4+ into the initial states as an output burst of a corresponding connection relationship; and a performance response burst formation step S800 of increasing the current state variable CUS by one, then forming a connection relationship from the current state to the initial state 0, forming performance response descending signals AckPC1−~AckPC4− for restoring all the performance response ascending signals AckPC1+~AckPC4+ into the initial states as an input burst of a corresponding connection relationship, and forming a response start descending signal Ack− for restoring a response start ascending signal Ack+ into the initial state as an output burst.

The operation of the asynchronous controller generation method according to the present invention having the above structure will be described with reference to the accompanying drawings.

Referring to FIG. 3 which is a flow-chart view showing a process-oriented asynchronous controller generation method according to the first embodiment of the present invention, the asynchronous controller generation method includes: a process controller formation step S100 of forming a signal transition graph with respect to a plurality of process controllers PC1~PC4 from a data flow graph; a process sequencing controller formation step S400 of forming a signal transition graph of a process sequencing controller PSC according to a performance sequence of the process controllers PC1~PC4 from the data flow graph; and a logic synthesis step S500 of generating an asynchronous controller in a logic synthesis program, by using the state of change in the input/output signals on the signal transition graph.

The process sequencing controller formation step S400 includes: a petri net formation step S200 of forming a petri net of modelling an operation of the process sequencing controller PSC comprised of a transition representing an operation according to a performance sequence of process controllers PC1~PC4 from the data flow graph, a place representing a state, a connection relationship between the transition and the place; and a signal transition graph formation step S300 of forming a signal transition graph having a state of change in input/output signals of the process sequencing controller PSC using the transition of the petri net.

Figure 5:
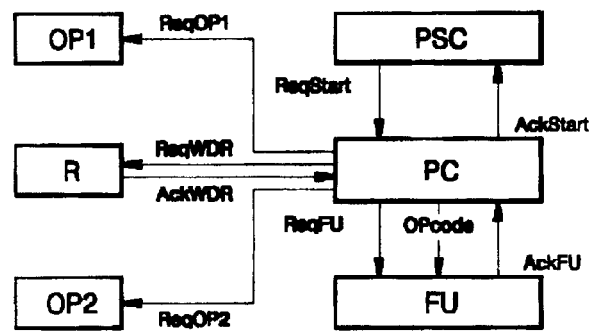
FIG. 5 is a diagram showing relationships between the process controller and the input/output signals according to the present invention.

FIG. 5 is a diagram showing relationships between the process controller and the input/output signals according to the present invention. The process controller PC plays a role of performing a process on the data flow graph, and thus controls an operand fetch, and an operand execution and an operation result storage in the data processor FU configured by an operation module including adders, subtracters and multipliers.

Figure 6A:
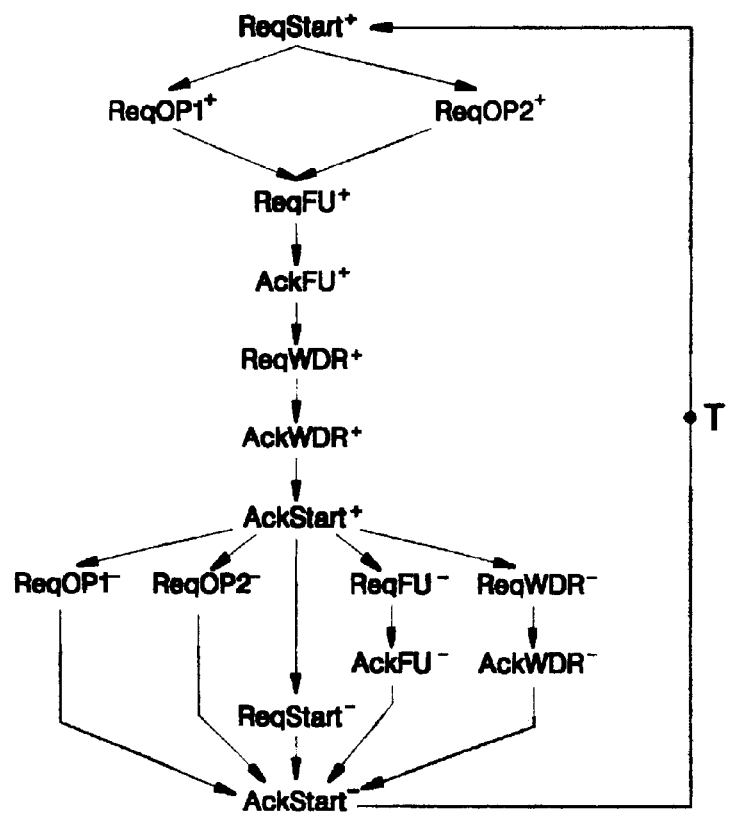
FIG. 6A is a first embodiment of the signal transition graph with respect to the process controller according to the present invention.

Referring to FIG. 4 showing a flow-chart of the process controller according to the present invention and FIG. 6A showing the signal transition graph with respect to the process controller according to the first embodiment of the present invention, the process controller formation step S100 for describing the signal transition graph according to the operation of the process controller PC will be described.

In the process controller activation step S110, a process controller PC is activated by a request start ascending signal ReqStart+ output from the process sequencing controller PSC, and starts a particular computing operation in the data processor FU. In the operand acquisition step S120, the process controller PC outputs operand request ascending signals ReqOP1+ and ReqOP1+ to a selector in order to select one of operands OP1 and OP2, to thereby acquire operands OP1 and OP2. In the data processing request step S140, the process controller PC outputs a data processing request ascending signal ReqFU+ to the data processor FU. In the data processing step S150, the data processor FU outputs a data processing response ascending signal AckcFU+ to the process controller PC with respect to an operation performance completion, in response to the data processing request ascending signal ReqFU+ if a time for performing a particular operation by the operand comes to an end. In the storage request step S160, the process controller PC outputs a storage request ascending signal ReqWDR+ to a target register R, in order to store the operation result performed in the data processor FU, in the target register R, and activates the target register R. In the data storage step S170, the target register R stores the operation result in response to the storage request ascending signal AckWDR+ output from the storage request step S160 and outputs a storage response ascending signal AckWDR+ to the process controller PC. In the completion step S180, the process controller PC outputs a response start ascending signal AckStart+ representing a computing operation completion of the data processor FU to the process sequencing controller PSC, and notifies the process sequencing controller PSC that all operations are completed. In the rest step S190, the process controller PC outputs descending signals ReqStart−, ReqOP1−, ReqOP1−, ReqFU−, AckFU−, ReqWDR−, AckWDR−, and AckStart− with respect to all the ascending signals ReqStart+, ReqOP1+, ReqOP1+, ReqFU+, AckFU+, ReqWDR+, AckWDR+, and AckStart+ in order to restore all the ascending signals ReqStart+, ReqOP1+, ReqOP1+, ReqFU+, AckFU+, ReqWDR+, AckWDR+, and AckStart+ into initial states.

The signal transition graph with respect to the process controller of FIG. 6A according to the present invention shows a sequence of the signal transition according to the input/output signal lines of the process controller shown in the flow-chart view showing the process controller formation step of FIG. 4, according to the present invention.

Figure 6B:
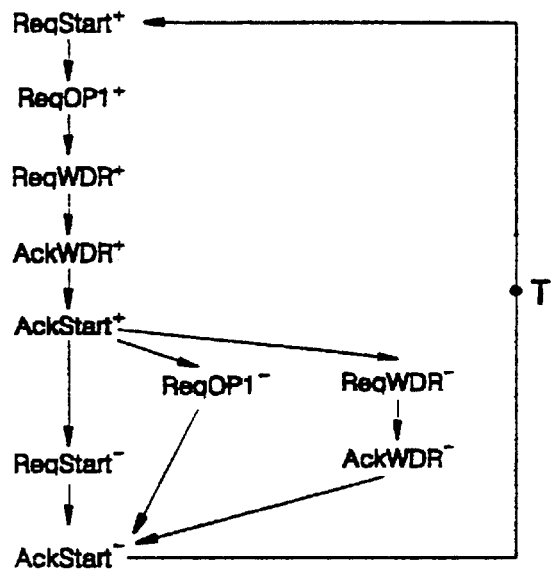
FIG. 6B is a second embodiment of the signal transition graph with respect to the process controller according to the present invention.
Figure 6C:
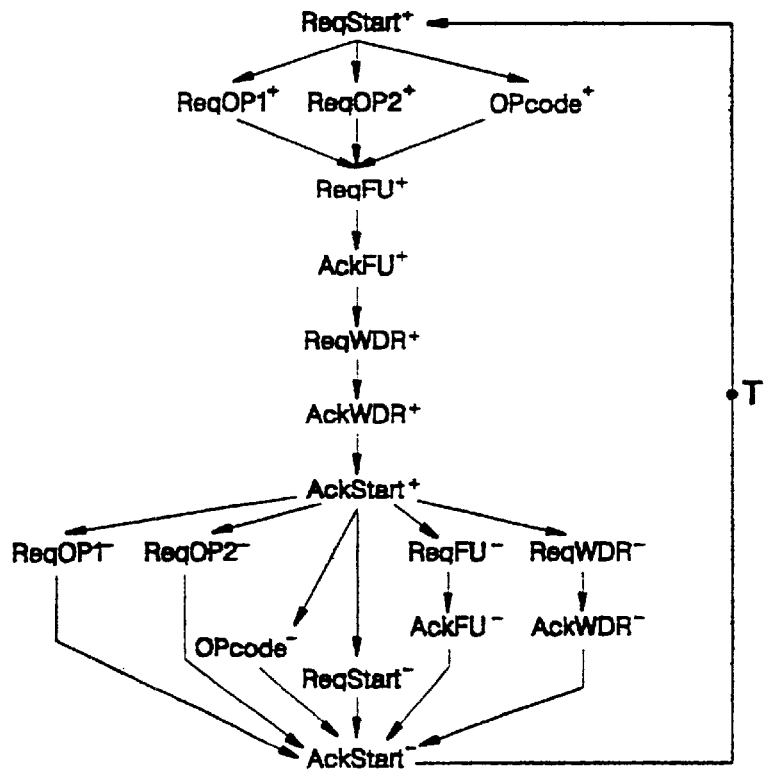
FIG. 6C is a third embodiment of the signal transition graph with respect to the process controller according to the present invention.

As shown in FIGS. 4 and 6C, the process controller PC further includes an operation select step S130 of outputting an operation code request ascending signal OPcode+ to the data processor FU in order to identify each operation, in the case that the data processor FU performs a number of operations.

FIG. 6B shows the signal transition graph in which the data processor FU does not perform a computing operation at the process controller formation step of FIG. 4 according to the present invention, and the operand is directly stored in the target register.

That is, the operation of the process controller formation step according to the second embodiment of the present invention will be described below.

The process controller activation step S110, the operand acquisition step S120, the storage request step S160, the data storage step S170, the completion step S180, and the rest step S190 are same as those of the first embodiment. However, in the storage request step S160, the process controller PC outputs to the target register R a storage request ascending signal ReqWDR+ for activating the target register R in order to store the operand OP1 acquired in the operand acquisition step S120 in the target register R.

Figure 7:
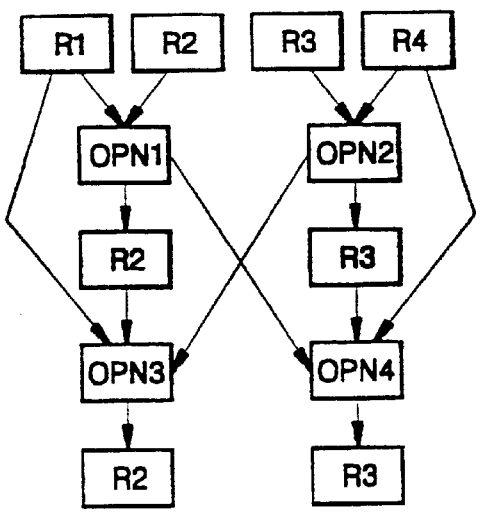
FIG. 7 is a data flow graph for the process sequencing controller according to the present invention.

FIG. 7 is a data flow graph for the process sequencing controller according to the present invention, in order to form a petri net for the process sequencing controller.

In the data flow graph of FIG. 7, each node OPN1~OPN4 represents an operation to be performed in the data processor FU. Here, reference symbols R1~R4 denote registers, and arrows denote performance sequences, respectively.

Figure 9:
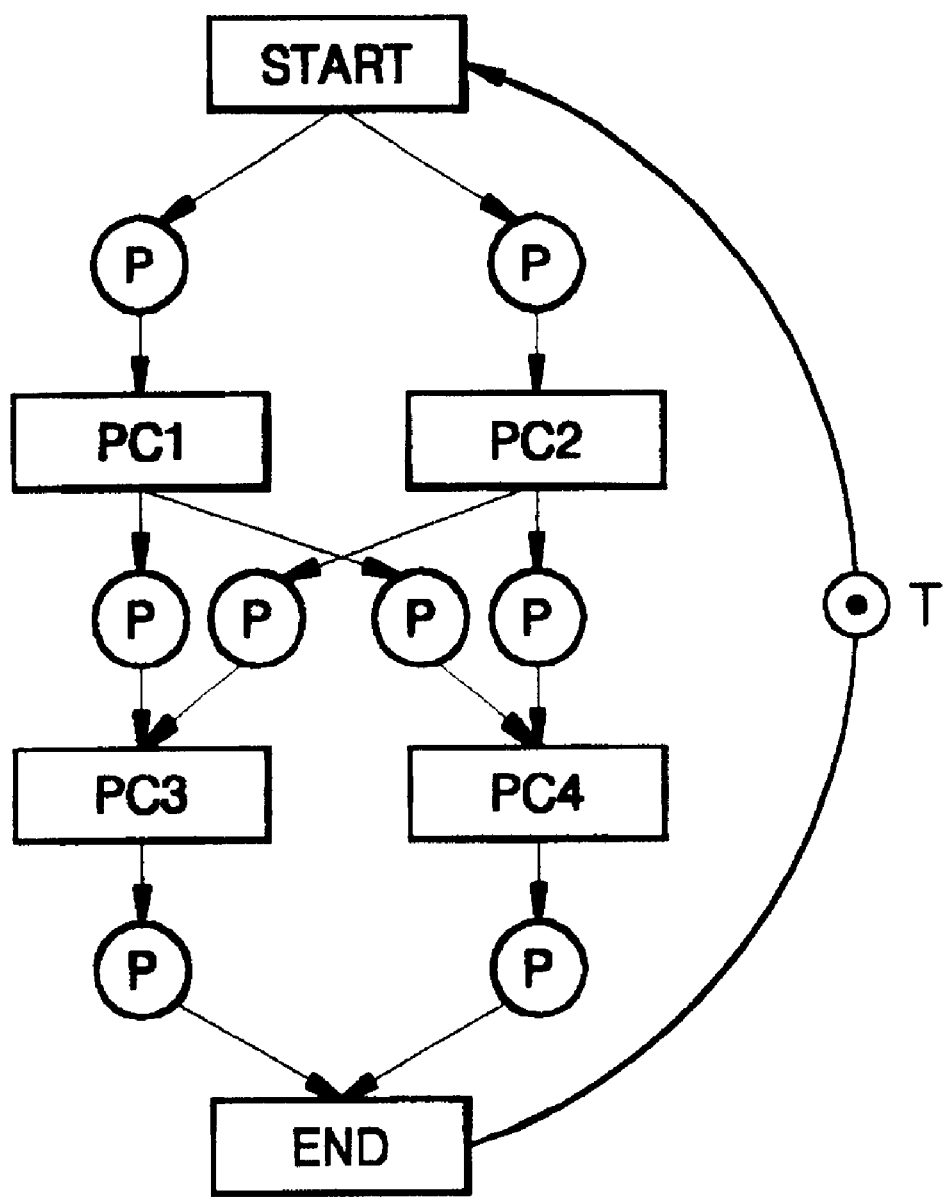
FIG. 9 is a diagram showing a process of inducing a petri net from the data flow graph for generating the process sequencing controller according to the present invention.

As shown in FIGS. 8 and 9, the operation of the petri net formation step for modelling the operation of the process sequencing controller from the data flow graph of FIG. 7 will be described below.

The start/end generation step S210 generates a start transition START and an end transition END representing a start and an end of the petri net, respectively. The performance control formation step S220 generates performance control transitions PC1~PC4 corresponding to an operation of each node OPN1~OPN4 on the data flow graph, connects the performance control transitions PC1~PC4 according to a sequential connection relationship between the respective nodes on the data flow graph, and sets a place P between the respective performance control transition connections. That is, the performance control transitions Pi of the petri net are generated with respect to the nodes OPN1 on the data flow graph, and the place P is generated between the respective performance control transitions PC1. Since there are connection relationships between the node OPN1 and each of the node OPN3 and the node OPN4 on the data flow graph, connections from the performance control transition PC1 to each of the performance control transition PC3 and the performance control transition PC4 are formed via the place P on the petri net. In the same method as the above, connections from the performance control transition PC2 to each of the performance control transition PC3 and the performance control transition PC4 are formed via the place P on the petri net. The first performance control transition formation step S230 generates a connection from the start transition START with respect to the performance control transitions PC1 and PC2, corresponding to nodes OPN1 and OPN2 having no preceding node on the data flow graph via a place P. The second performance control transition formation step S240 generates a connection from the performance control transitions PC3 and PC4 to the end transition END, corresponding to nodes OPN3 and OPN4 having no following node on the data flow graph via a place P. The completion step S250 generates a connection from the end transition END to the start transition START, sets a place P at a connection between the end transition END and the start transition START and forms a token representing a start position at the set place.

Figure 11:
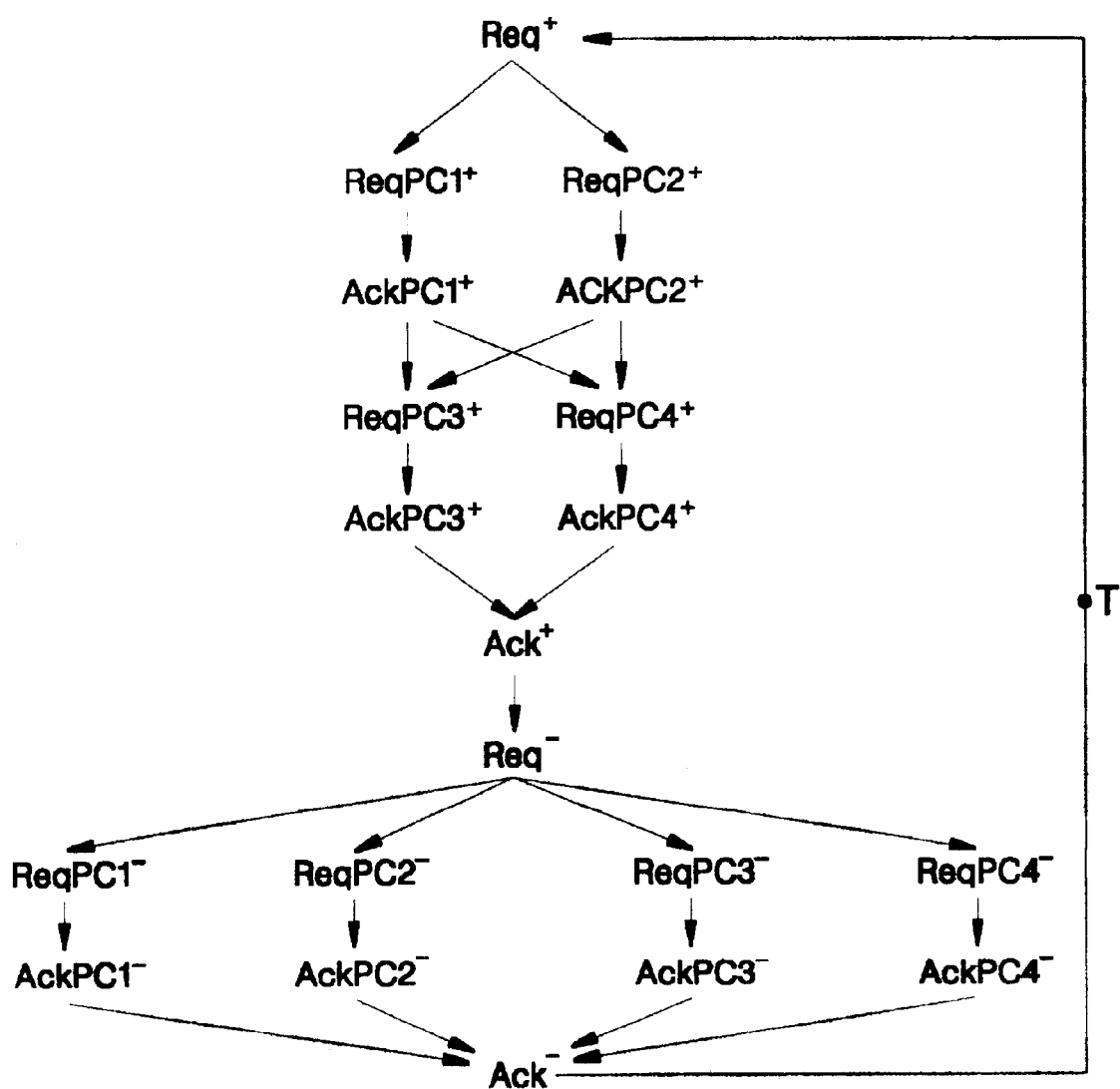
FIG. 11 is a diagram showing a process of inducing a signal transition graph with respect to the process sequencing controller from the petri net.

As shown in FIGS. 10 and 11, the operation of the signal transition graph formation step with respect to the process sequencing controller from the petri net with respect to the process sequencing controller of FIG. 9, will be described below.

The start/end conversion step S310 converts the start transition START of the petri net into a request ascending signal Req+, divides the end transition END into a response ascending signal Ack+ and a request descending signal Req−, to thereby form a signal transition state from the response ascending signal Ack+ to the request descending signal Req−, that is, Ack+→Req−. The first performance control conversion step S320 divides each of the performance control transitions PC1~PC4 of the petri net into performance request ascending signals ReqPC1+, ReqPC2+, ReqPC3+, and ReqPC4+ and performance response ascending signals AckPC1+, AckPC2+, AckPC3+, and AckPC4+, and forms a signal transition state from the performance request ascending signals ReqPC1+, ReqPC2+, ReqPC3+, and ReqPC4+ to the performance response ascending signals AckPC1+, AckPC2+, AckPC3+, and AckPC4+, that is, ReqPC1+→AckPC1+, ReqPC2+→AckPC2+, ReqPC3+→AckPC3+, ReqPC4+→AckPC4+. The first signal transition conversion step S330 forms a signal transition state from the request ascending signal Req+ formed in the start/end conversion step S310 to the performance request ascending signals ReqPC1+ and ReqPC2+ formed in the first performance control conversion step S320, with respect to each of all the performance control transitions PC1 and PC2 connected through the start transition START and the place P of the petri net, that is, Req+→ReqPC1+, Req+→ReqPC2+. The second signal transition conversion step S340 forms a signal transition state from the performance request ascending signals ReqPC3+ and ReqPC4+ formed in the first performance control conversion step S320 to the response ascending signal Ack+ formed in the start/end conversion step S310 with respect to each of all the performance control transitions PC3 and PC4 preceding the end transition END and connected through the end transition END and the place P of the petri net, that is, AckPC3+→Ack+, AckPC4+→Ack+. The third signal transition conversion step S350 forms a signal transition state from the performance response ascending signals AckPC1+ and AckPC2+ of the current performance control transitions PC1 and PC2 to the performance request ascending signals ReqPC3+ and ReqPC4+ of the next performance control transitions PC3 and PC4, in the case that the current performance control transitions PC1 and PC2, the following performance control transitions PC3 and PC4 and the places P are connected in sequence on the petri net, that is, AckPC1+→ReqPC3+, AckPC1+→ReqPC4+, AckPC2+→ReqPC3+, AckPC2+→ReqPC4+. The second performance control conversion step S360 divides each of the performance control transitions PC1~PC4 of the petri net into performance request descending signals ReqPC1−, ReqPC2−, ReqPC3− and ReqPC4− and performance response descending signals AckPC1−, AckPC2−, AckPC3− and AckPC4− and forms a signal transition state from the performance request descending signals ReqPC1−, ReqPC2−, ReqPC3− and ReqPC4− to the performance response descending signals AckPC1−, AckPC2−, AckPC3− and AckPC4−, that is, ReqPC1−→AckPC−, ReqPC2−→AckPC2−, ReqPC3−→AckPC3−, ReqPC4−→AckPC4−. The response descending signal formation step S370 forms a response descending signal Ack− corresponding to the request ascending signal Req+ of the start/end conversion step S310. The descending signal transition conversion step S380 forms a signal transition state from the request descending signal Req− of the start/end conversion step S310 to all the performance request descending signals ReqPC1−, ReqPC2−, ReqPC3− and ReqPC1− generated in the second performance control conversion step S360, that is, Req−→ReqPC1−, Req−→ReqPC2−, Req−→ReqPC3−, Req−→ReqPC4−, and forms a signal transition state from all the performance response descending signals AckPC1−, AckPC2−, AckPC3− and AckPC4− generated in the second performance control conversion step S360 to the response descending signal Ack−, that is, AckPC1−→Ack−, AckPC2−→Ack−, AckPC3−→Ack−, AckPC4−→Ack−. The completion step S390 forms a signal transition state from the response descending signal Ack− to the request ascending signal Req+, that is, Ack−→Req+, and forms a token T representing a start position of the signal transition graph.

FIG. 12 is a flow-chart view showing a process-oriented asynchronous controller generation method according to a second embodiment of the present invention. As shown in FIG. 12, the operation of the asynchronous controller generation method according to the second embodiment of the present invention will be described below.

The process controller formation step S600 forms a finite state machine including an input burst which is a set of input signals input to the process controller PC and an output burst which is a set of output signals output from the process controller PC, in order to output control signals necessary for performing a process corresponding to a node on the data flow graph showing a performance sequence between a plurality of nodes each representing a process and a plurality of processes. The process sequencing controller formation step S700 forms a finite state machine of a process sequencing controller according to a performance sequence of the process controllers PC from the data flow graph. The logic synthesis step S900 generates an asynchronous controller in a logic synthesis program, by using the state of change in the input burst and the output burst of the finite state machines in the process controllers PC and the process sequencing controller PSC.

As shown in FIG. 13A showing a first embodiment of the finite state machine with respect to the process controller according to the present invention, the operation of the process controller formation step S600 according to the present invention will be described below.

A connection 0→1 from an initial state 0 to a first state 1 is formed, a request start ascending signal ReqStart+ output from the process sequencing controller PSC and input to the process controller PC is formed as an input burst, and operand request ascending signals ReqOP1+ and ReqOP2+ according to a request start ascending signal ReqStart+ and a data processing request ascending signal ReqFU+ for performing an operation in the data processor FU are formed as an output burst. That is, ReqStart+/ReqOP1+, ReqOP2+ and ReqFU+ are formed. A connection 1→2 from the first state 1 to a second state 2 is formed, an operation by an operand in the data processor FU is performed in response to the data processing request ascending signal ReqFU+, a data processing response ascending signal AckFU+ with respect to an operation performance completion input from the data processor FU to the process controller PC is formed as an input burst, and a storage request ascending signal ReqWDR+ for activating a target register R in order to store an operation result performed in the data processor FU according to the data processing response ascending signal AckFU+ in the target register R, is formed as an output burst. That is, AckFU+/ReqWDR+ is formed. The connection 2→3 from the second state 2 to a third state 3 is formed, a storage response ascending signal AckWDR+ with respect to an operation result storage completion input from the target register R to the process controller PC in response to the storage request ascending signal ReqWDR+ is formed as an input burst, and a response start ascending signal AckStart+ output from the process controller PC to the process sequencing controller PSC in response to a request start ascending signal ReqStart+, and operand request descending signals ReqOP1- and ReqOP2-, a data processing request descending signal ReqFU- and storage request descending signal ReqWDR-for restoring operand request ascending signals ReqOP1+ and ReqOP2+, a data processing request ascending signal ReqFU+ and a storage request ascending signal ReqWDR+ output from the process controller PC, are formed as an output burst. That is, AckWDR+/AckStart+, ReqOP1-, ReqOP2-, ReqFU- and ReqWDR- are formed. A connection 3→0 from the third state 3 to the initial state 0 is formed, a data processing response descending signal AckFU-, a storage response descending signal AckWDR- and a request start descending signal ReqStart- for restoring all of the data processing response ascending signal AckFU+, the storage response ascending signal AckWDR+ and the request start ascending signal ReqStart+ input to the process controller PC into the initial states, are formed as an input burst, and the response start descending signal AckStart- for restoring the response start ascending signal AckStart+ output from the process controller PC to the process sequencing controller PSC into the initial state, is formed as an output burst. That is, AckFU-, AckWDR- and ReqStart-/AckStart- are formed.

FIG. 13B shows the finite state machine in which the data processor FU does not perform a computing operation using an operand after acquiring the operand and the acquired operand is directly stored in the target register R. The operation of the process controller formation step S600 of FIG. 13B is same as that of FIG. 13A.

FIG. 13C is a third embodiment of the finite state machine with respect to the process controller according to the present invention. The process controller formation step S600 according to the third embodiment of the present invention as shown in FIG. 13C is same as that of the first embodiment of the present invention of FIG. 13A. In the process controller formation step S600 as shown in FIG. 13C, an operation code request ascending signal Opcode+ for identifying each operation is further formed at the connection formation step from the initial state 0 to the first state 1 in the output burst and an operation code request descending signal Opcode- for restoring the operation code request ascending signal Opcode+ into the initial state is further formed at the connection formation step from the second state 2 to the third state 3 in the output burst, in the case that a number of operations are performed in the data processor FU.

Figure 15:
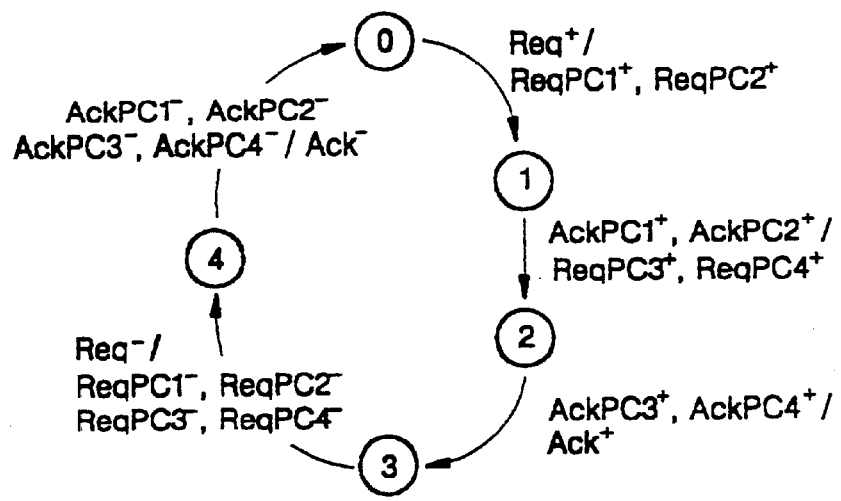
FIG. 15 is a diagram showing a process of inducing finite state machine with respect to the process sequencing controller according to the present invention from the data flow graph.

FIG. 14 is a flow-chart view showing a finite state machine with respect to the process sequencing controller according to the present invention from the data flow graph. The operation of the process sequencing controller formation step S700 will be described below with reference to the data flow graph of FIG. 7 and the induction process of the finite state machine with respect to the process sequencing controller of FIG. 15.

In the initial state formation step S710, an initial state 0 is formed, and the current state variable CUS representing a current state is set zero. In the connection formation step S720, a following state is formed whenever the current state variable CUS increases by one, and a connection relationship 0→1, 1→2, 2→3 is formed from the current state to the following state. In the detection step S730, it is detected whether the current state variable CUS is zero. In the request start ascending signal formation step S740, the input burst of the connection relationship forms a request start ascending signal Req+ if the current state variable CUS is zero in the detection step S730. In the input burst node formation step S750, response ascending signals AckPC1+, AckPC2+, AckPC3+ and AckPC4+ corresponding to performance request ascending signals ReqPC1+, ReqPC2+, ReqPC3+ and ReqPC4+ constituting an output burst of the connection relationship from the previous state prior to the current state to the current state as an input burst, if the current state variable CUS is not zero in the detection step S730. In the preceding node presence and absence judgement step S760, it is detected whether a node having no preceding node exists on the data flow graph. In the output burst node formation step S770, performance request ascending signals ReqPC1+ and ReqPC2+ corresponding to nodes OPN1 and OPN2 are formed as an output burst if the nodes OPN1 and OPN2 having no preceding node exist in the preceding node presence and absence judgment step S760, the current state variable CUS is increased by one after the nodes OPN1 and OPN2 having no preceding node are deleted and the program proceeds to the connection formation step S720.

That is, an input burst when a state transition is made from the initial state 0 to the first state 1 is the request start ascending signal Req+ by the detection step S730 and the S740 step, and an output burst is performance request ascending signals ReqPC1+ and ReqPC2+ by the output burst node formation step S770.

An input burst when a state transition is made from the first state 1 to the second state 2 is the performance response ascending signals AckPC1+ and AckPC2+ corresponding to the performance request ascending signals ReqPC1+ and ReqPC2+ which are the output burst at the initial state 0 by the input burst node formation step S750, and an output burst is performance request ascending signals ReqPC3+ and ReqPC4+ by the output burst node formation step S770.

An input burst when a state transition is made from the second state 2 to the third state 3 is the performance response ascending signals AckPC3+ and AckPC4+ corresponding to the performance request ascending signals ReqPC3+ and ReqPC4+ which are the output burst at the second state 2 by the input burst node formation step S750, and an output burst is the response start ascending signal Ack+ corresponding to the request start ascending signal Req+, since there is no node having no preceding node in the preceding node presence and absence judgment step S760.

In the performance request burst formation step S790, a response start ascending signal Ack+ is formed as an output burst, then the current state variable CUS is increased by one from 3, then a fourth state 4 is formed, a connection relationship is formed from the third state 3 being the current state to the fourth state 4, a request start descending signal Req- for restoring a request start ascending signal Req+ into the initial state is formed as an input burst, and performance request descending signals ReqPC1-~ReqPC4- for restoring all the performance request ascending signals ReqPC1+~ReqPC4+ into the initial states are formed as an output burst of a corresponding connection relationship.

In the performance response burst formation step S800, a connection relationship from the fourth state 4 being the current state to the initial state 0 is formed, performance response descending signals AckPC1-~AckPC4- for restoring all the performance response ascending signals AckPC1+~AckPC4+ into the initial states are formed as an input burst of a corresponding connection relationship, and a response start descending signal Ack- for restoring a response start ascending signal Ack+ into the initial state is formed as an output burst.

Figure 16:
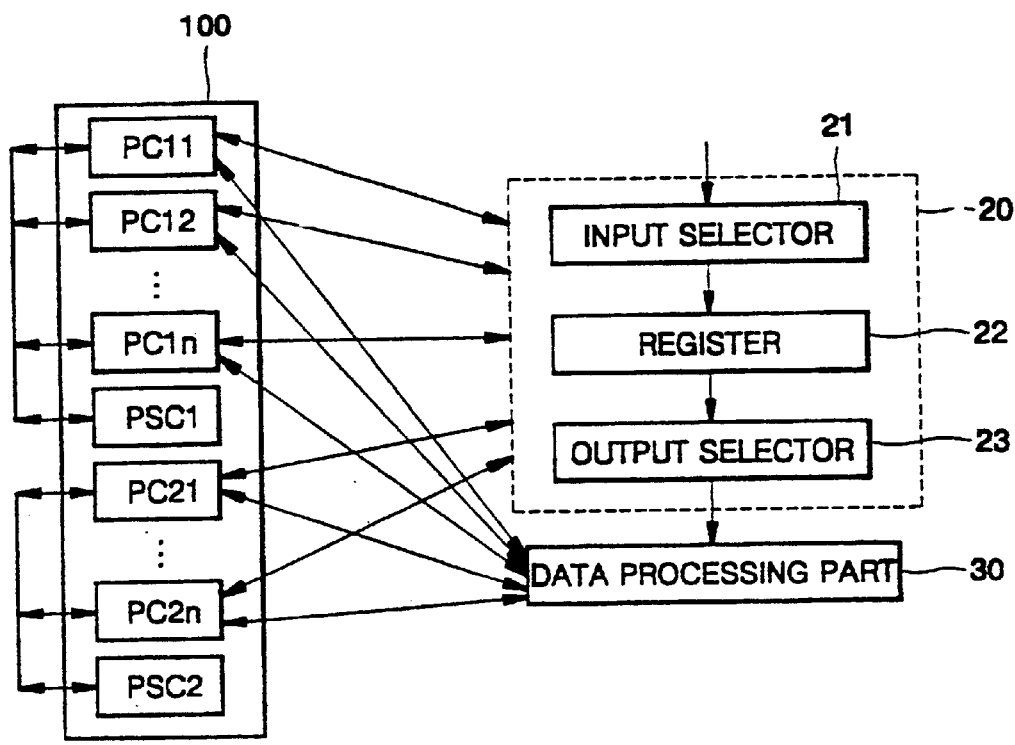
FIG. 16 is a diagram showing the structure and operation of the asynchronous controller according to the present invention.

FIG. 16 is a diagram showing the structure of the asynchronous controller according to the present invention. Referring to FIG. 16, the process controller in the asynchronous controller controls an input selector 21, a register 22 and an output selector 23 which form an input/output processor 20 and a data processor 30. The process sequencing controller in the asynchronous controller plays a role of activating the process controllers in the asynchronous controller according to a given sequence on the data flow graph.

Figure 17:
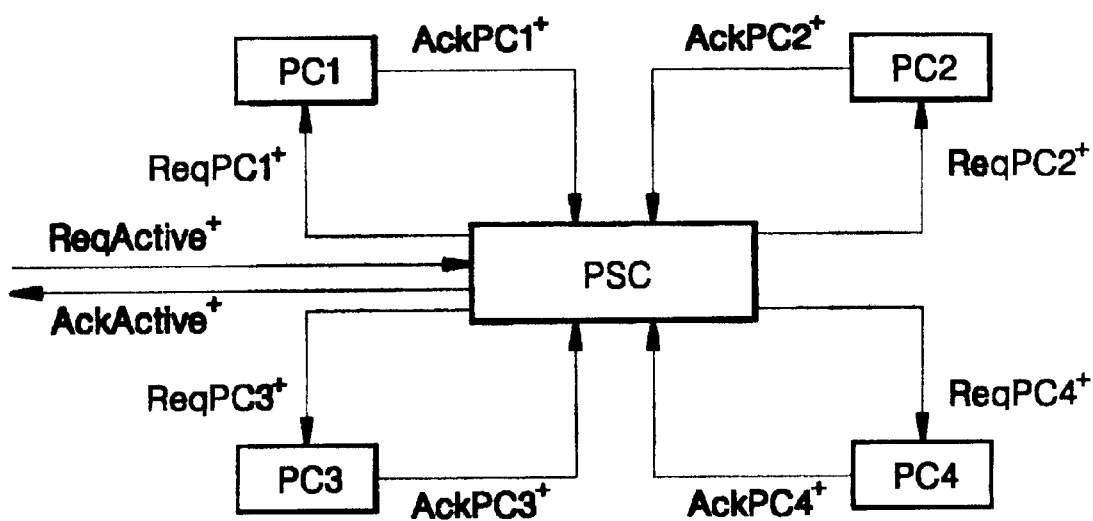
FIG. 17 is a diagram for explaining the operations of the process controller and the process sequencing controller according to the present invention.

FIG. 17 is a diagram for explaining the operations through a signal exchange between the process controller and the process sequencing controller constituting the asynchronous controller according to the present invention, which shows an asynchronous controller with respect to the data flow graph of FIG. 7.

If an activation request ascending signal ReqActive+ for activating the asynchronous controller is applied to the process sequencing controller PSC externally, the process sequencing controller applies the request ascending signals ReqPC1+ and ReqPC2+ to the process controllers PC1 and PC2 for performing the processes OPN1 and OPN2 which have to be performed in the earliest according to a given sequence on the data flow graph, to thereby activate the asynchronous controller. The process controllers PC1 and PC2 having started the operations by the process sequencing controller PSC output response ascending signals AckPC1+ and AckPC2+ to the process sequencing controller PSC, after completion of the performance of the processes, to thereby indicate that the processes have been completed. As soon as the process sequencing controller PSC has received the response ascending signals AckPC1+ and AckPC2+ from the process controllers PC1 and PC2, it outputs the request ascending signals ReqPC3+ and ReqPC4+ to the process controllers PC3 and PC4 for performing processes OPN3 and OPN4 to be performed in the next operation, to thereby activate the process controllers PC3 and PC4. The process controllers PC3 and PC4 have completed the performance of the processes, and then output the response ascending signals AckPC3+ and AckPC4+ to the process sequencing controller PSC, to thereby indicate that the processes have been completed. After completion of all the processes, the process sequencing controller PSC outputs the activation response ascending signal AckActive+ to the outside. Thereafter, if the activation request descending signal ReqActive- is applied to the process sequencing controller as an input, the process sequencing controller PSC outputs request descending signals ReqPC1-, ReqPC2-, ReqPC3- and ReqPC4- for restoring request ascending signals ReqPC1+, ReqPC2+, ReqPC3+ and ReqPC4+ with respect to the process controllers PC1~PC4 into the initial states to the process controllers PC1~PC4, and the process controllers PC1~PC4 having received the request descending signals output response descending signals AckPC1-, AckPC2-, AckPC3- and AckPC4- to the process sequencing controller PSC, respectively. After having received all the response descending signals, the process sequencing controller PSC outputs the activation response descending signal AckActive- to the outside, to then complete all the operations.

The asynchronous controller generation method according to the present invention provides an excellent asynchronous controller in view of an area, a performance and a synthesis time, in which the asynchronous controller is divided and induced into process controllers described as a number of signal transition graphs or finite state machines for generating control signals necessary for performing a process corresponding to a node on a data flow graph, and a process sequencing controller described as a signal transition graph or a finite state machine for controlling a performance sequence of the process controllers.

As described above, the present invention has been described with respect to the particularly preferred embodiments thereof. However, the present invention is not limited to the above embodiments, but various modifications and corrections can be possible by one who has an ordinary skill in the art without departing off the spirit of the present invention and within the technical scope of the appended claims.

What is claimed is:

1. A method for generating an asynchronous controller for forming a signal transition graph representing a state of change in input/output signals of the asynchronous controller from a data flow graph showing a performance sequence between a plurality of nodes each representing a process and a plurality of processes, and controlling a data processor to perform an operation from the signal transition graph by a logic synthesis program, the asynchronous controller generation method comprising:

a process controller formation step of forming a signal transition graph of a plurality of process controllers for outputting control signals necessary for executing a process corresponding to a node in the data flow graph;

a process sequencing controller formation step of forming a signal transition graph of a process sequencing controller according to a performance sequence of the process controllers from the data flow graph; and a logic synthesis step of generating an asynchronous controller in a logic synthesis program, by using the state of change in the input/output signals on the signal transition graph of the process controllers formed in the process controller formation step and the state of change in the input/output signals on the signal transition graph of the process sequencing controller formed in the process sequencing controller formation step.

2. The asynchronous controller generation method of claim 1, wherein said process sequencing controller formation step comprises:

a petri net formation step of forming a petri net of a process sequencing controller comprised of a transition representing an operation according to a performance sequence of process controllers from the data flow graph, a place representing a state, a connection relationship between the transition and the place; and a signal transition graph formation step of forming a signal transition graph having a state of change in input/output signals of the process sequencing controller using the transition of the petri net.

3. The asynchronous controller generation method of claim 1, wherein said process controller formation step comprises:

a process controller activation step for activating a process controller by a request start ascending signal for starting a computing operation in a data processor output from the process sequencing controller;

an operand acquisition step of outputting operand request ascending signals in order to acquire operands for performing an operation by the data processor, which is performed in the process controller;

a data processing request step of outputting a data processing request ascending signal to the data processor in order to perform an operation by the data processor, which is performed in the process controller;

a data processing step for performing an operation by the operands acquired in the operand acquisition step and outputting a data processing response ascending signal to the process controller with respect to an operation performance completion, in response to the data processing request ascending signal output from the data processing request step;

a storage request step of outputting a storage request ascending signal to a target register, in order to activate the target register and in order to store the operation result performed in the data processor, which is performed in the process controller;

a data storage step for storing the operation result in response to the storage request ascending signal output from the storage request step and outputting a storage response ascending signal to the process controller, which is performed in the target register;

a completion step of outputting a response start ascending signal representing a computing operation completion of the data processor to the process sequencing controller, which is performed in the process controller; and a rest step of outputting descending signals with respect to all the ascending signals in order to restore all the ascending signals into initial states, which is performed in the process controller.

4. The asynchronous controller generation method of claim 3, wherein said data processing request step further comprises an operation select step of outputting an operation code request ascending signal to the data processor in order to identify each operation, which is performed in the process controller.

5. The asynchronous controller generation method of claim 3, wherein said petri net formation step comprises:

a start/end generation step of generating a start transition and an end transition representing a start and an end of the petri net, respectively;

a performance control formation step of generating performance control transitions corresponding to an operation of each node on the data flow graph, connecting the performance control transitions according to a sequence if there is a sequential connection relationship between the respective nodes on the data flow graph, and setting a place between the respective performance control transition connections;

a first performance control transition formation step of generating a connection from the start transition with respect to the performance control transitions, corresponding to nodes having no preceding node on the data flow graph and setting a place at a connection between the start and each of the performance control transitions;

a second performance control transition formation step of generating a connection from the performance control transitions to the end transition, corresponding to nodes having no following node on the data flow graph and setting a place at a connection between each of the performance control transitions and the end transition; and a completion step of generating a connection from the end transition to the start transition formed in the start/end generation step, setting a place at a connection between the end transition and the start transition and forming a token representing a start position at the set place.

6. The asynchronous controller generation method of claim 3, wherein said signal transition graph formation step comprises:

a start/end conversion step of converting the start transition of the petri net into a request ascending signal, converting the end transition into a response ascending signal and a request descending signal to thereby form a signal transition state from the response ascending signal to the request descending signal;

a first performance control conversion step of converting each of the performance control transitions of the petri net into performance request ascending signals and performance response ascending signals, and forming a signal transition state from the performance request ascending signals to the performance response ascending signals;

a first signal transition conversion step of forming a signal transition state from the request ascending signal formed in the start/end conversion step to the performance request ascending signals formed in the first performance control conversion step, with respect to each of all the performance control transitions connected through the start transition and the place of the petri net;

a second signal transition conversion step of forming a signal transition state from the performance request ascending signals formed in the first performance control conversion step to the response ascending signal formed in the start/end conversion step with respect to each of all the performance control transitions preceding the end transition and connected through the end transition and the place of the petri net;

a third signal transition conversion step of forming a signal transition state from the performance response ascending signals of the current performance control transitions to the performance request ascending signals of the next performance control transitions, in the case that the current performance control transitions, the following performance control transitions and the places are connected in sequence on the petri net;

a second performance control conversion step of converting each of the performance control transitions of the petri net into performance request descending signals and performance response descending signals and forming a signal transition state from the performance request descending signals to the performance response descending signals;

a response descending signal formation step of forming a response descending signal corresponding to the request ascending signal of the start/end conversion step;

a descending signal transition conversion step of forming a signal transition state from the request descending signal of the start/end conversion step to all the performance request descending signals generated in the second performance control conversion step, and forming a signal transition state from all the performance response descending signals generated in the second performance control conversion step to the response descending signal; and a completion step of forming a signal transition state from the response descending signal to the request ascending signal, and forming a token representing a start position of the signal transition graph.

7. The asynchronous controller generation method of claim 1, wherein said process controller formation step comprises:

a process controller activation step for activating a process controller by a request start ascending signal ReqStart+ output from the process sequencing controller;

an operand acquisition step of outputting an operand request ascending signals in order to acquire an operand, which is performed in the process controller;

a storage request step of outputting a storage request ascending signal to a target register, in order to activate the target register and in order to store the operand acquired in the operand acquisition step in the target register, which is performed in the process controller;

a data storage step for storing the operand in response to the storage request ascending signal output from the storage request step and outputting a storage response ascending signal to the process controller, which is performed in the target register;

a completion step of outputting a response start ascending signal representing an operand storage completion to the process sequencing controller, which is performed in the process controller; and a rest step of outputting descending signals with respect to all the ascending signals in order to restore all the ascending signals into initial states, which is performed in the process controller.

8. A method for generating an asynchronous controller for forming a finite state machine including an input burst which is a set of input signals of the asynchronous controller and an output burst which is a set of output signals corresponding to the input signals from a data flow graph showing a performance sequence between a plurality of nodes each representing a process and a plurality of processes, and controlling a data processor to perform an operation from the finite state machine by a logic synthesis program, the asynchronous controller generation method comprising:

a process controller formation step of forming a finite state machine including an input burst being a set of input signals input to a process controller and an output burst being a set of output signals output from the process controller in order to output control signals necessary for executing a process corresponding to a node in the data flow graph;

a process sequencing controller formation step of forming a finite state machine of a process sequencing controller according to a process sequence of the process controllers from the data flow graph; and a logic synthesis step of generating an asynchronous controller in a logic synthesis program, by using the state of change in the input burst and the output burst of the finite state machine in the process controllers formed in the process controller formation step and the state of change in the input burst and the output burst in the finite state machine of the process sequencing controller formed in the process sequencing controller formation step.

9. The asynchronous controller generation method of claim 8, wherein said process controller formation step comprises:

a first stage including the steps of forming a connection from an initial state 0 to a first state 1, forming a request start ascending signal output from the process sequencing controller and input to the process controller as an input burst from the initial state 0 to the first state 1, and forming operand request ascending signals according to a request start ascending signal and a data processing request ascending signal for performing an operation in the data processor, as an output burst;

a second stage including the steps of forming a connection from the first state 1 to a second state 2, performing an operation by an operand in the data processor in response to the data processing request ascending signal, forming a data processing response ascending signal with respect to an operation performance completion input from the data processor to the process controller, as an input burst, and forming a storage request ascending signal for activating a target register in order to store an operation result performed in the data processor according to the data processing response ascending signal in the target register, as an output burst;

a third stage including the steps of forming a connection from the second state 2 to a third state 3, forming a storage response ascending signal with respect to an operation result storage completion input from the target register to the process controller in response to the storage request ascending signal as an input burst, and forming a response start ascending signal output from the process controller to the process sequencing controller in response to a request start ascending signal, and operand request descending signals, a data processing request descending signal and storage request descending signal for restoring operand request ascending signals, a data processing request ascending signal and a storage request ascending signal output from the process controller, as an output burst; and a fourth stage including the steps of forming a connection from the third state 3 to the initial state 0, forming a data processing response descending signal, a storage response descending signal and a request start descending signal for restoring all of the data processing response ascending signal, the storage response ascending signal and the request start ascending signal input to the process controller into the initial states, as an input burst, and forming the response start descending signal for restoring the response start ascending signal output from the process controller to the process sequencing controller into the initial state, as an output burst.

10. The asynchronous controller generation method of claim 9, wherein in the process controller formation step, an operation code request ascending signal for identifying each operation is further formed at the connection formation step from the initial state 0 to the first state 1 in the output burst and an operation code request descending signal for restoring the operation code request ascending signal into the initial state is further formed at the connection formation step from the second state 2 to the third state 3 in the output burst, in the case that a number of operations are performed in the data processor.

11. The asynchronous controller generation method of claim 8, wherein said process controller formation step S600 comprises:

a first stage including the steps of forming a connection from an initial state 0 to a first state 1, forming a request start ascending signal output from the process sequencing controller and input to the process controller as an input burst from the initial state 0 to the first state 1, and forming an operand request ascending signal and a storage request ascending signal for activating a target register in order to store an operand in the target register, as an output burst;

a second stage including the steps of forming a connection from the first state 1 to a second state 2, forming a storage response ascending signal with respect to an operand storage completion input from the target register to the process controller in response to the storage request ascending signal, as an input burst, and forming a response start ascending signal output from the process controller to the process sequencing controller in response to the request start ascending signal, an operand request descending signal and a storage request descending signal for restoring an operand request ascending signal and a storage request ascending signal output from the process controller into the initial states, as an output burst; and a third stage including the steps of forming a connection from the second state 2 to the initial state 0, forming a storage response descending signal and a request start descending signal for restoring all of the storage response ascending signal and the request start ascending signal input to the process controller into the initial states, as an input burst, and forming a response start descending signal for restoring a response start ascending signal output from the process controller to the process sequencing controller into the initial state, as an output burst.

12. The asynchronous controller generation method of claim 8, wherein said process sequencing controller formation step comprises:

an initial state formation step of forming an initial state 0 and setting a current state variable representing a current state into zero;

a connection formation step of a following state whenever the current state variable increases by one, and forming a connection relationship from the current state to the following state;

a detection step of detecting whether the current state variable is zero;

a request start ascending signal formation step of forming a request start ascending signal in the input burst of the connection relationship if the current state variable is zero in the detection step;

an input burst node formation step of forming response ascending signals corresponding to performance request ascending signals constituting an output burst of the connection relationship from the previous state prior to the current state to the current state if the current state variable is not zero in the detection step;

a preceding node presence and absence judgement step of detecting whether a node having no preceding node exists on the data flow graph;

an output burst node formation step of forming performance request ascending signals corresponding to nodes as an output burst if the nodes having no preceding node exist in the preceding node presence and absence judgment step, increasing the current state variable by one after deleting the nodes having no preceding node and proceeding to the connection formation step;

an output burst formation step of forming a response start ascending signal corresponding to a request start ascending signal as an output burst, if a node having no preceding node does not exist in the preceding node presence and absence judgment step;

a performance request burst formation step of forming a response start ascending signal as an output burst, then increasing the current state variable by one, then forming a following state, forming a connection relationship from the current state to the following state, forming a request start descending signal for restoring a request start ascending signal into the initial state as an input burst of a corresponding connection relationship, and forming performance request descending signals for restoring all the performance request ascending signals into the initial states as an output burst of a corresponding connection relationship; and a performance response burst formation step of increasing the current state variable by one, then forming a connection relationship from the current state to the initial state 0, forming performance response descending signals for restoring all the performance response ascending signals into the initial states as an input burst of a corresponding connection relationship, and forming a response start descending signal for restoring a response start ascending signal into the initial state as an output burst.

* * * * *